(12) United States Patent
Mimura

(10) Patent No.: US 6,545,211 B1
(45) Date of Patent: Apr. 8, 2003

(54) SOLAR CELL MODULE, BUILDING MATERIAL WITH SOLAR CELL MODULE, SOLAR CELL MODULE FRAMING STRUCTURE, AND SOLAR POWER GENERATION APPARATUS

(75) Inventor: Toshihiko Mimura, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/481,543

(22) Filed: Jan. 12, 2000

(30) Foreign Application Priority Data

Jan. 14, 1999 (JP) .......................... 11-007185
Jan. 7, 2000 (JP) ........................ 2000-001206

(51) Int. Cl.$^7$ ........................................ H01L 31/042
(52) U.S. Cl. ...................... 136/244; 136/293; 136/291; 136/290; 323/906; 52/173.3; 60/641.8
(58) Field of Search ................... 136/244, 293, 136/291, 290; 323/906; 52/173.3; 60/641.8

(56) References Cited

U.S. PATENT DOCUMENTS

| | | | | |
|---|---|---|---|---|
| 4,649,334 A | * | 3/1987 | Nakajima | .................. 136/293 |
| 5,592,074 A | | 1/1997 | Takehara | ..................... 363/131 |
| 5,669,987 A | * | 9/1997 | Takehara et al. | ............ 136/244 |
| 5,782,994 A | * | 7/1998 | Mori et al. | .................. 136/251 |
| 6,162,986 A | * | 12/2000 | Shiotsuka et al. | .......... 136/244 |
| 6,180,868 B1 | * | 1/2001 | Yoshino et al. | ............. 136/244 |
| 6,346,670 B1 | * | 2/2002 | Fuji et al. | .................... 136/293 |

FOREIGN PATENT DOCUMENTS

| | | | |
|---|---|---|---|
| EP | 964457 A2 | * | 12/1999 |
| JP | 6-125105 | | 5/1994 |
| JP | 9-148613 | | 6/1997 |
| JP | 9-148613 A | * | 6/1997 |

* cited by examiner

Primary Examiner—Alan Diamond
(74) Attorney, Agent, or Firm—Fitzpatrick, Cella, Harper & Scinto

(57) ABSTRACT

A solar cell module includes an electrical parameter detection unit including an operating current detector unit for a solar cell element and a communication unit for communicating an output from the operating current detection unit, thereby providing a solar cell module capable of easily specifying a malfunctioning solar cell module.

29 Claims, 20 Drawing Sheets

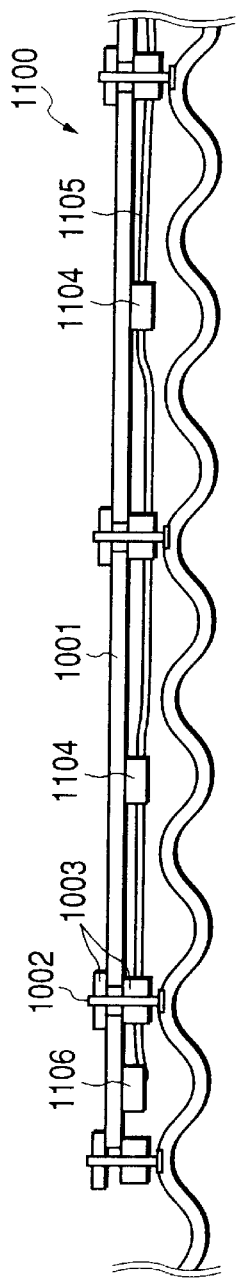
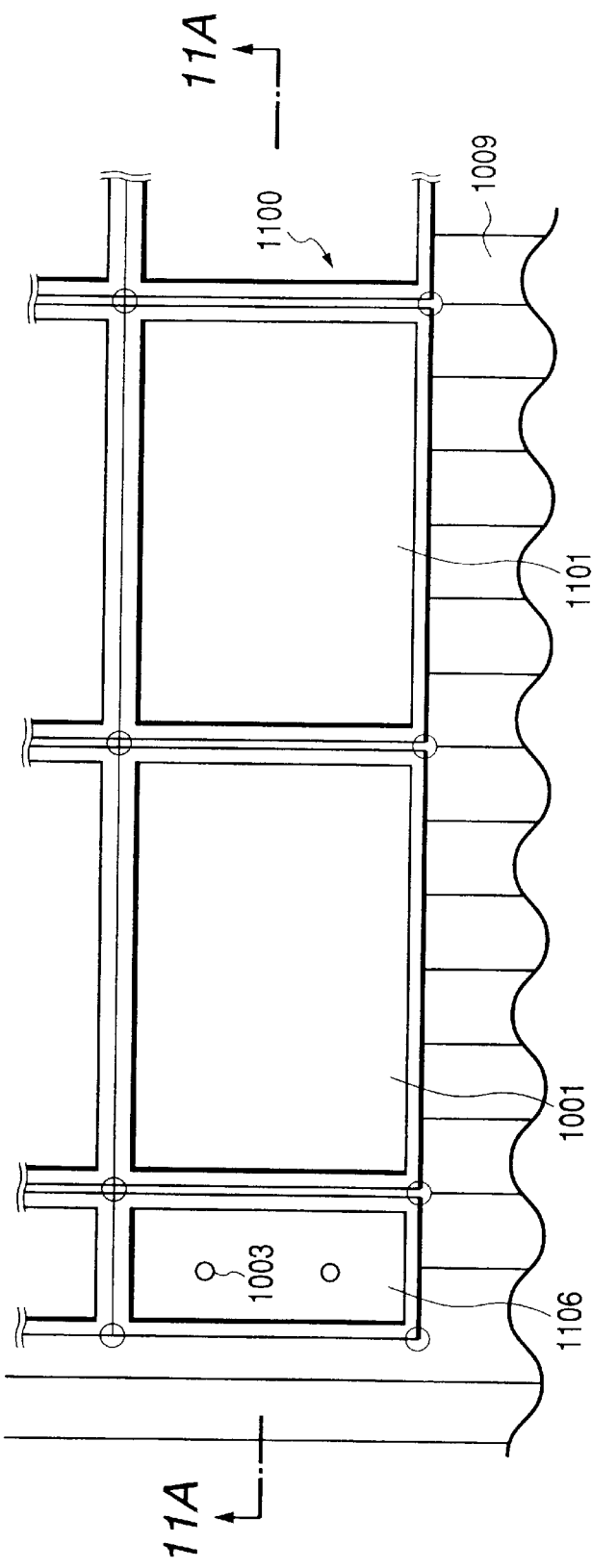
FIG. 11A
FIG. 11B

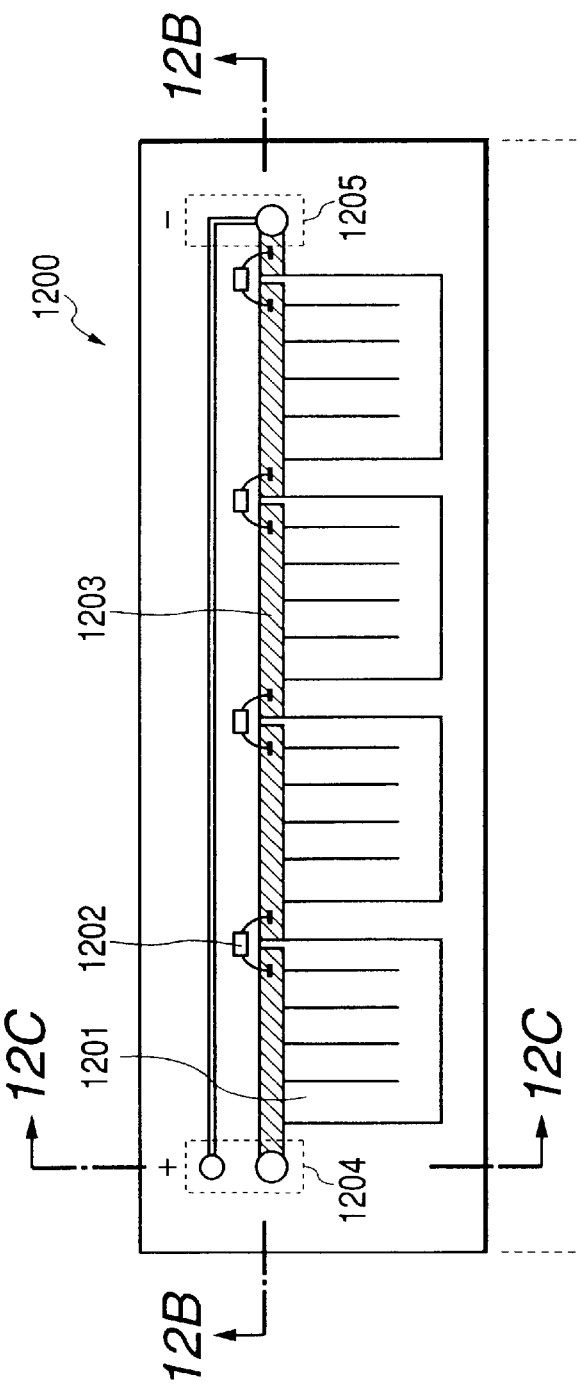
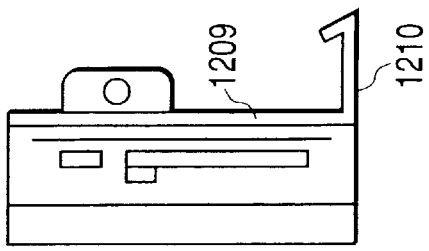
FIG. 12A
FIG. 12C
FIG. 12B

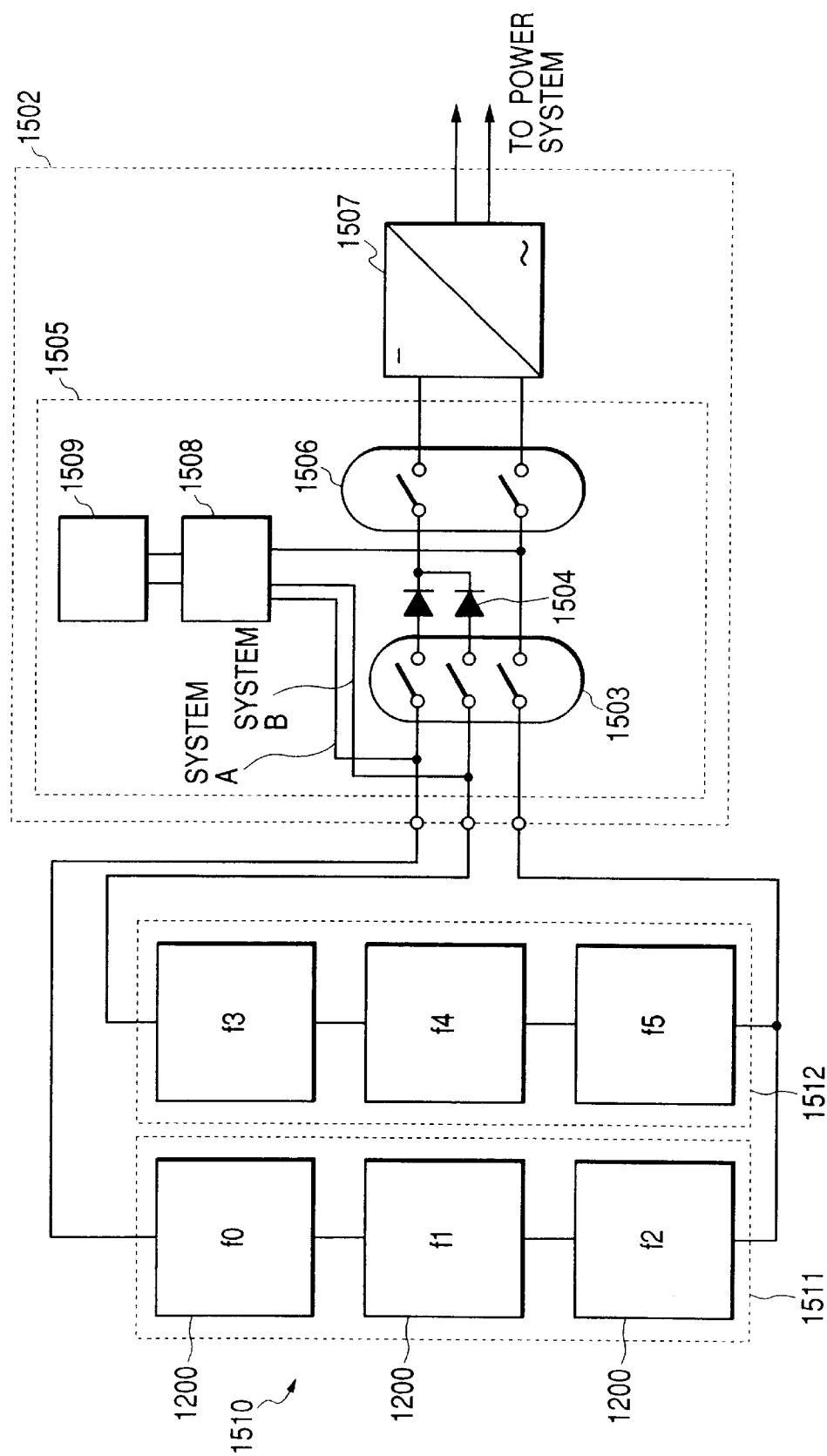

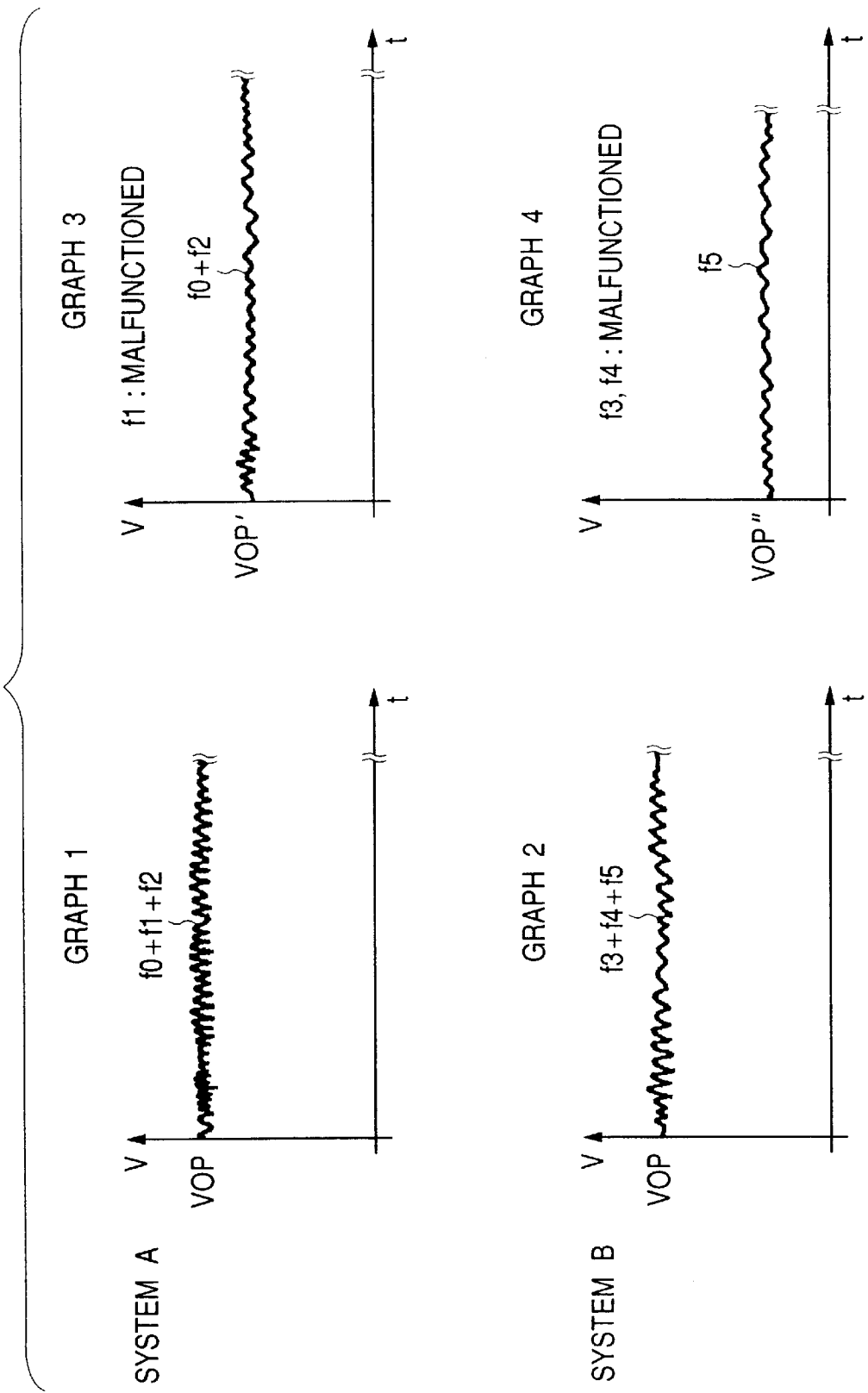

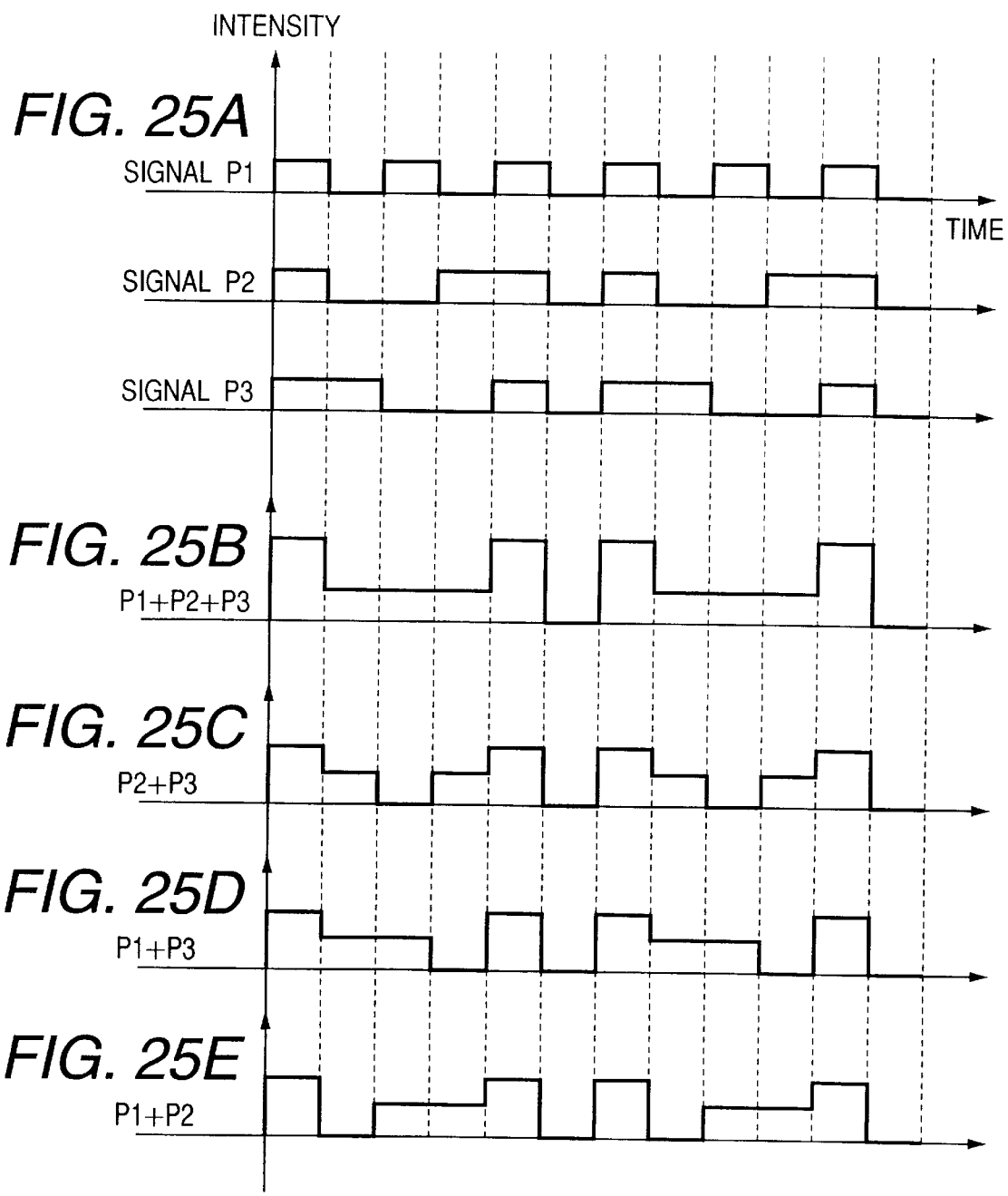

SOLAR CELL MODULE, BUILDING MATERIAL WITH SOLAR CELL MODULE, SOLAR CELL MODULE FRAMING STRUCTURE, AND SOLAR POWER GENERATION APPARATUS

BACKGROUND OF THE INVENTION

1. Field of the Invention

The present invention relates to a solar cell module, a building material with a solar cell module, a solar cell module framing structure, and a solar power generation apparatus.

2. Related Background Art

In recent years, solar cell modules have been very popular. Demand has greatly arisen for solar cell modules for a middle-scale power system installed outdoors in personal residences.

To generally use solar cell modules for a power system, a plurality of modules are connected in series to obtain a series unit for generating a predetermined voltage or more. The series units are connected in parallel to form a solar cell array.

An example of a circuit diagram of a solar cell module 2401 will be described in FIG. 24A. The solar cell module 2401 has a solar cell element A1 and a bypass diode A2 connected in parallel to the solar cell element A1. When the solar cell module 2401 is partially shadowed, the solar cell element A1 is set in a high-resistance state, and the following phenomenon called "partial shadow" occurs. That is, a voltage generated by the solar cell modules in other series units is applied as a reverse bias voltage to the solar cell module via a load. The bypass diode A2 drains the reverse bias voltage applied to the solar cell element A1 in the solar cell module to prevent damage to the solar cell element A1.

When some solar cell modules of the solar cell array made up of a plurality of solar cell models malfunction to cause an abnormal array output, the malfunctioning portions are detected as follows. It is checked if an electrical output from each series unit is normal. The solar power generation apparatus is then stopped. The electrical outputs from the respective solar cell modules constituting the series units are measured using output terminals of the solar cell modules which are located on the nonexposed surfaces of the solar cell modules.

Since these output terminals are often located on the lower surfaces of the solar cell modules, it is very difficult to measure the electrical outputs from the solar cell modules upon installation. A detection terminal may be arranged for each solar cell module. However, when the detection terminal is exposed outside, short circuiting or power shock may occur, thus suffering a problem on reliability. In general, no detection terminal is arranged for each solar cell module.

To specify the malfunction in the solar cell array, a method of measuring a current flowing in the wiring of the solar cell array using a clamp type ammeter is generally practiced.

Conventional solar cell modules each having a current detection unit not exposed outside are disclosed in Japanese Patent Application Laid-open No. 6-125105 in FIGS. 24B-1 and 24B-2 and Japanese Patent Application Laid-open No. 9-148613 in FIG. 24C).

Referring to FIGS. 24B-1 and 24B-2, solar cell modules 2401 have magnetic field generation unit B1 and B2, respectively. Referring to FIG. 24C, a solar cell module 2401 has a light-emitting unit C1. As shown in FIG. 24B-1, when an operating current of the solar cell flows in the magnetic field generation unit B2, a magnetic field is generated. As shown in FIG. 24B-1, when a current flows into a bypass diode A2, the magnetic field generation unit B1 generates a magnetic field. As shown in FIG. 24C, the light-emitting unit C1 is turned on when a current flows into a bypass diode A2. The ON/OFF operation of the light-emitting unit can be visually checked. The magnetic field generated by the magnetic field generation unit can be checked by a magnetic needle or a lead switch sensing a magnetic field.

The arrangement shown in FIG. 24B-2 detects the malfunction using generation of a current (I1: operating current) during operation of the solar cell element A1. The arrangement shown in FIG. 24B-1 detects the malfunction when a reverse bias voltage is generated by the same principle of partial shadow in the solar cell module when the voltage of the solar cell element A1 lowers due to the malfunction to flow a current (I2: current flowing upon malfunction of the solar cell module) through the bypass diode A2.

These methods of specifying the malfunctions of the solar cell modules suffer the following problems.

(1) When the solar cell array malfunctions, the operator must go up to the installation surface of the solar cell modules and check the solar cell modules on the installation surface one by one. The job is cumbersome, and the "partial shadow" occurs due to the shadow of the operator himself on the solar cell modules. It is difficult to specify a malfunctioning solar cell module.

(2) A given sunbeam is required to specify a malfunctioning solar cell module. For example, to specify the malfunction of a solar cell in a cloudy day, the magnetic field generation unit and light-emitting unit cannot properly operate. It is, therefore, difficult to specify a malfunctioning solar cell module.

(3) Since the conventional malfunction detection method is based on a single parameter such as an operating current of the solar cell element or current flowing through the bypass diode, these methods cannot cope with a variety of malfunction modes of solar cell elements and a solar cell array arrangement.

The present invention has been made in consideration of the conventional problems described above, and has as its object to provide a solar cell module capable of easily detecting or specifying a malfunctioning solar cell module by providing the following unit, and a building material with the solar cell module, a solar cell module framing structure, and a solar power generation apparatus.

SUMMARY OF THE INVENTION

The present invention has been made in consideration of the above problems.

More specifically, it is an object of the present invention to more easily and accurately specify the malfunction of a solar cell module. It is another object is to easily specify a malfunctioning solar cell module.

It is still another object of the present invention to provide a solar cell module comprising at least one solar cell element, at least one electrical parameter detection unit for the solar cell element, and communication unit for performing communication in accordance with an output from the electrical parameter detection unit. It is still another object to provide a solar cell module building material having this solar cell module.

It is still another object of the present invention to provide a solar cell module framing structure having the solar cell module, a nonsolar cell member, and display unit responding to a signal from the communication unit, wherein the display unit is arranged on the nonsolar cell member.

The communication unit preferably has signal generation unit and more preferably has superposing unit.

It is still another object of the present invention to provide a solar power generation apparatus having a plurality of solar cell modules and signal generation unit arranged for the plurality of solar cell modules. Preferably this solar power generation apparatus has the display unit and is installed in a power-related device.

Preferably, the solar power generation apparatus comprises superposing unit and signal separation unit.

Since the communication unit is arranged in the solar cell module, the operator need not check whether the malfunction occurs near the solar cell module. The shadow of the operator himself is not formed on the solar cell module. This allows the operator to accurately specify the malfunction.

Since the display unit which receives a signal from the communication unit is centralized in the nonsolar cell member forming the solar cell module framing structure, the cost of the display member can be reduced. Since the display unit can be located at an unnoticeable position, the degree of freedom in design of the solar cell array can increase.

The display unit for receiving a signal from the communication unit can be incorporated in the power-related device such as an inverter. With this arrangement, the operator need not go up to the installation surface to specify a malfunctioning solar cell module, thus improving maintainability. In this arrangement, a display device conventionally used in a power control device can serve as this display unit. In addition, when recording unit is used together with this display unit, the electrical parameter of each solar cell module in a fine day is recorded in advance, and the malfunctioning solar cell module can be specified based on the electrical parameter. The malfunctioning solar cell module can be specified even in a cloudy day and can be replaced with a new one in the cloudy day.

External communication unit may be used to make a control device of a power company or subcontractor cooperate with a computer in the power-related device via a telephone line. More accurate malfunction detection and regional operation of the solar power generation apparatus are allowed on the basis of a larger quantity of parameter information than that in conventional malfunction detection, and changes over time of the parameter information.

The signal generation unit for generating a specific signal (ID information) is arranged in units of solar cell modules. The malfunctioning solar cell module can be specified due to the presence/absence of this signal or the difference between such signals.

The signal generated by the signal generation unit is superposed on the electrical output from the solar cell module. The electrical output cable of the solar cell module is used as the path of the signal from the signal generation unit. The signal from the signal generation unit can be easily supplied to the power-related device such as an inverter. A dedicated wiring for feeding such a signal need not be arranged, thus facilitating installation and maintenance. The material cost of the dedicated wiring can be reduced.

As described above, according to the present invention, a malfunctioning solar cell module can be easily specified, thus improving maintainability.

BRIEF DESCRIPTION OF THE DRAWINGS

FIGS. 8A, 8B and 8C show the solar cell module according to the first embodiment of the present invention, in which FIG. 8A is a schematic plan view, FIG. 8B is a schematic sectional view along the line 8B—8B, and FIG. 8C is a partial enlarged view of a terminal box;

FIGS. 11A and 11B show a solar cell module framing structure according to the first embodiment of the present invention, in which FIG. 11A is a schematic sectional view along the line 11A—11A and FIG. 11B is a schematic plan view;

FIGS. 12A, 12B and 12C show the solar cell module according to the second embodiment of the present invention, in which FIG. 12A is a schematic plan view, FIG. 12B is a schematic sectional view along the line 12B—12B, and FIG. 12C is a schematic end view along the line 12C—12C;

FIG. 15 is a block diagram of the solar power generation apparatus according to the second embodiment of the present invention;

FIG. 16 is a view for explaining frequency signals according to the second embodiment of the present invention;

FIGS. 17A and 17B show a solar cell module according to the third embodiment of the present invention, in which FIG. 17A is a schematic plan view and FIG. 17B is a schematic sectional view along the line 17B—17B;

FIGS. 24A, 24B-1, 24B-2 and 24C are circuit diagrams showing the arrangements of conventional solar cell modules; and FIGS. 25A, 25B, 25C, 25D and 25E are views for explaining signals according to the third embodiment of the present invention.

DETAILED DESCRIPTION OF THE PREFERRED EMBODIMENTS

Solar Cell Modules

FIGS. 1 to 5 show typical modes of solar cell modules according to the present invention.

<First Mode>

Figure 1:
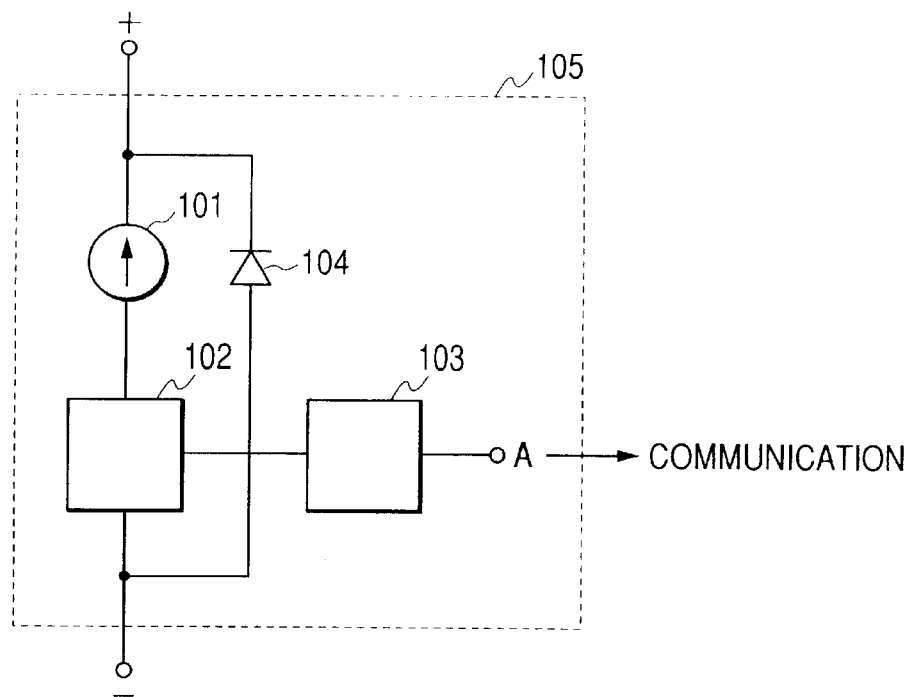
FIG. 1 is a block diagram showing the first mode of a solar cell module according to the present invention.

FIG. 1 is a circuit diagram showing the first mode. A solar cell element 101 is connected in series with an operating current detection unit 102. When the operating current detection unit 102 detects an operating current having a predetermined value or more, a communication unit 103 notifies an external device outside a solar cell module 105 of the fact that the operating current has the predetermined value or more. A bypass diode 104 is connected parallel to the series circuit made up of the solar cell element 101 and operating current detection unit 102. A communication signal from the communication unit 103 is extracted from a communication terminal A of the solar cell module 105.

In this mode, the operating current having the predetermined value or more in the solar cell module is detected as the electrical parameter, and the detection result is communicated. In this mode, the electrical parameter detection unit is comprised of the operating current detection unit 102. This unit is one of the easy arrangements.

<Second Mode>

Figure 2:
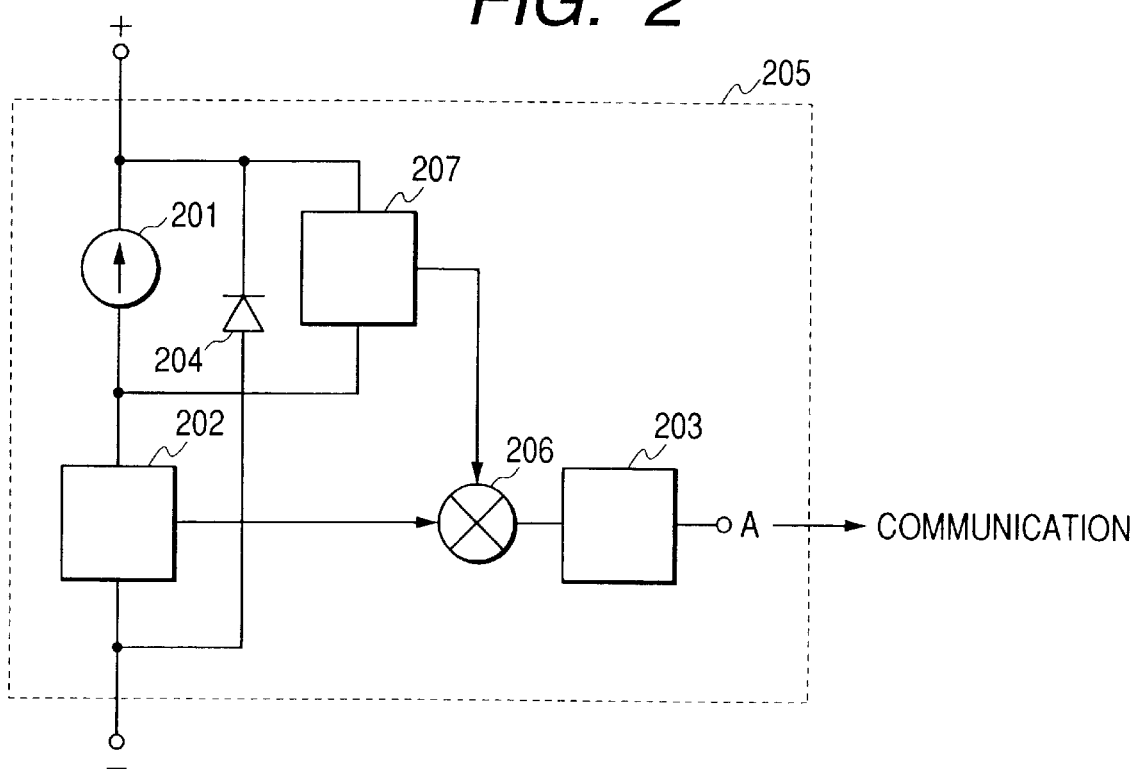
FIG. 2 is a block diagram showing the second mode of the solar cell module according to the present invention.

FIG. 2 is a block diagram showing the second mode. A solar cell element 201 is connected in series with an operating current detection unit 202. A bypass diode 204 is connected parallel to the series circuit made up of the solar cell element 201 and operating current detection unit 202. A voltage detection unit 207 detects a voltage across the solar cell element 201. An arithmetic unit 206 calculates the product (power) of the voltage detected by the voltage detection unit and the current detected by the operating current detection unit 202. A communication unit 203 communicates the calculation result of the arithmetic unit 206 outside a solar cell module 205.

In this mode, the operating current of the solar cell element and the voltage applied to the solar cell element are measured as electrical parameters. The voltage and current are multiplied to obtain a power value, and the power value is communicated. The electrical parameter detection unit of this mode is made up of the operating current detection unit 202, voltage detection unit 207, and arithmetic unit 206. More accurate malfunction detection is allowed.

<Third Mode>

Figure 3:
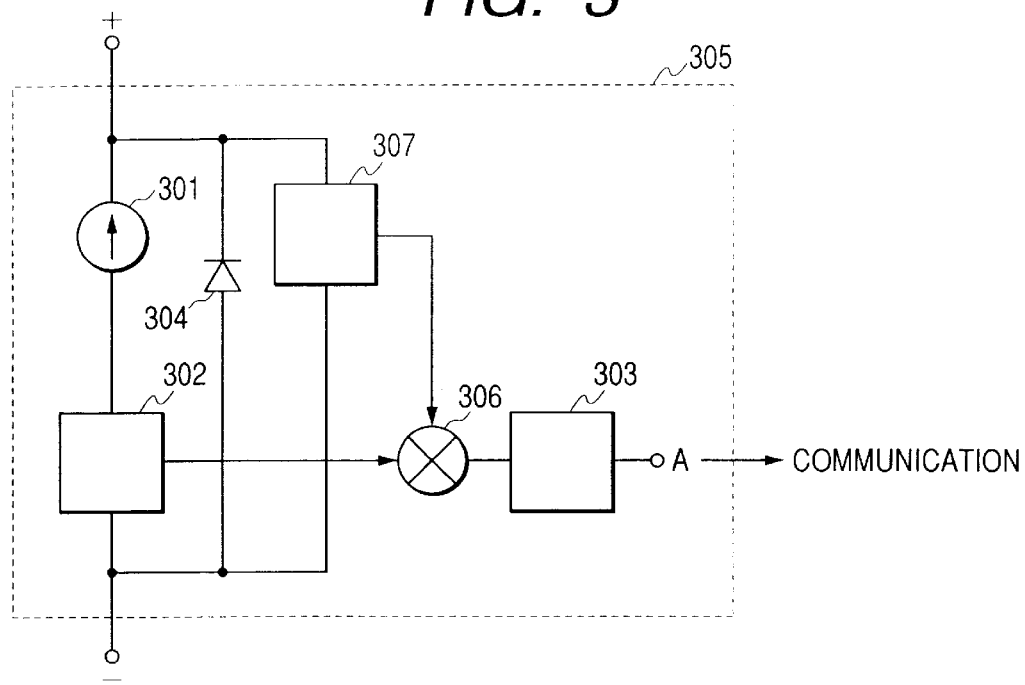
FIG. 3 is a block diagram showing the third mode of the solar cell module according to the present invention.

FIG. 3 is a block diagram showing the third mode. A solar cell element 301 is connected in series with an operating current detection unit 302. A bypass diode 304 is connected in parallel to the series circuit made up of the solar cell element 301 and operating current detection unit 302. A voltage detection unit 307 is connected parallel to the series circuit made up of the solar cell element 301 and operating current detection unit 302. An arithmetic unit 306 calculates the product (power) of the voltage detected by the voltage detection unit and the current detected by the operating current detection unit 302. A communication unit 303 communicates the calculation result of the arithmetic unit 306 outside a solar cell module 305.

In this mode, the operating current of the solar cell element and the voltage applied to the entire solar cell module are multiplied to obtain a power value, and the power value is communicated. The electrical parameter detection unit of this mode is made up of the operating current detection unit 302, voltage detection unit 307, and arithmetic unit 306. More accurate malfunction detection is allowed as in FIG. 2.

<Fourth Mode>

Figure 4:
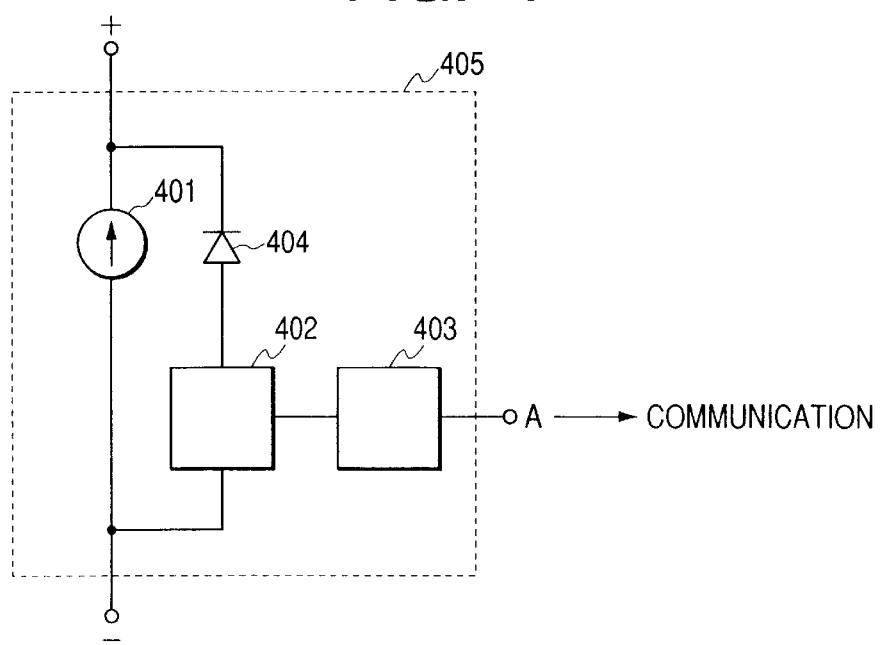
FIG. 4 is a block diagram showing the fourth mode of the solar cell module according to the present invention.

FIG. 4 is a block diagram showing the fourth mode. A solar cell element 401 is connected in series with a bypass diode 404. A bypass current detection unit 402 is inserted in series in the circuit of the bypass diode 404. A communication unit 403 communicates a detection signal from the bypass current detection unit 402 outside a solar cell module 405.

In this mode, the bypass current from the bypass diode 404 is used and communicated as an electrical parameter. The electrical parameter detection unit of this mode is made up of the bypass current detection unit 402. This unit is one of the easy arrangements.

<Fifth Mode>

Figure 5:
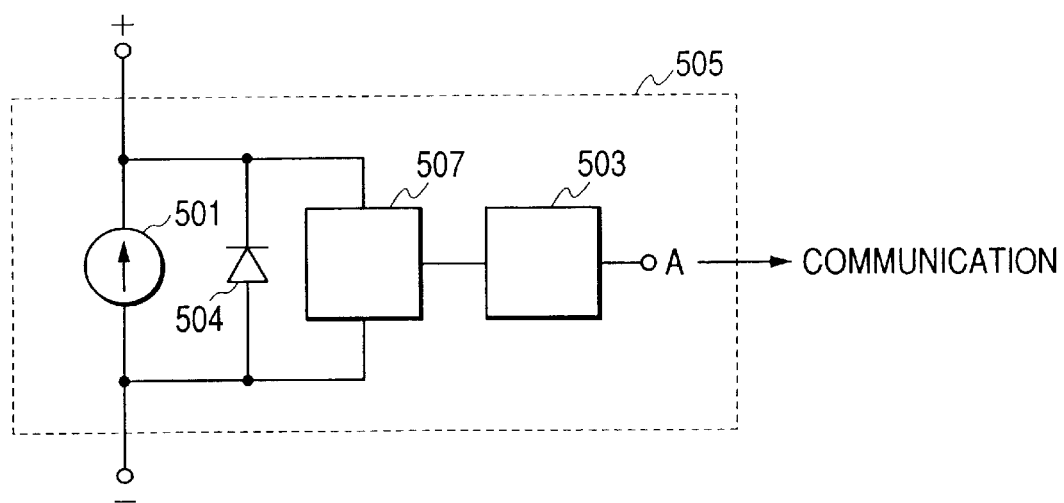
FIG. 5 is a block diagram showing the fifth mode of the solar cell module according to the present invention.

FIG. 5 is a block diagram showing the fifth mode. A solar cell element 501 is connected in series with a bypass diode 504. An operating voltage detection unit 507 is connected in series with the solar cell element 501. A communication unit 503 communicates a detection signal from the operating voltage detection unit 507 outside a solar cell module 505.

In this mode, the operating voltage of the solar cell module is used and communicated as the electrical parameter. The electrical parameter detection unit in this mode is made up of the operating voltage detection unit 507. This unit is one of the easy arrangements. More accurate malfunction detection than malfunction detection using a current is allowed. A series or parallel unit of solar cell elements may be used in place of each of the solar cell elements 101, 201, 301, 401, and 501. A current detection unit, voltage detection unit, and communication unit may be arranged for each solar cell element.

The constituent elements of the above modes will be supplementarily described.

(Electrical Parameter Detection Unit)

The typical arrangements of the electrical parameter detection unit for detecting electrical parameters to be communicated have been described above. Each electrical parameter detection unit is comprised of one or a combination of the voltage detection unit and current detection unit, or a combination of the voltage detection unit, current detection unit, and arithmetic unit. As the detection unit, a known sensor or an integrated circuit such as a microcomputer can be used. The number of electrical parameters to be detected need not be one. For example, electrical parameter data can be processed by a built-in computer. Alternatively, a switchable inspection load can be arranged in a solar cell module, an IV characteristic is measured, and then the measured characteristic can be transmitted via the electrical parameter communication unit.

(Communication Unit)

The communication unit is used to communicate an electrical parameter outside the solar cell module. The simplest arrangement of the communication unit is a driver for externally outputting an electrical parameter signal output from the electrical parameter detection unit. To transmit a plurality of electrical parameters, the communication unit may include a signal generation unit. The communication unit may also include a superposing unit. In this case, electrical parameter signal can be superposed on the DC output from the solar cell module. Any signal generation unit can be used if it can generate any signal. Examples of signals used are a voltage, current, and optical signals. A circuit capable of generating any signal is used as the signal generation unit, and examples of the output signal are a periodic signal (e.g., a sinusoidal, triangular, or rectangular signal) and an intermittent (nonperiodic) signal generated in response to an input signal. Examples of the signal generation unit are an oscillator and a digital modulator. As the superposing unit, a transformer or the like can be used. As the communication unit, an integrated circuit such as a microcomputer can be used. An integrated circuit having the communication unit and electrical parameter detection unit can be used.

(Bypass Diode)

In addition to conventionally known diodes such as silicon and germanium diodes, any rectifier made of selenium can be used. The rectifier must be operated by a reverse bias voltage before the solar cell element breaks. Any conventional molded diode can be used. In recent years, a diode formed in part of a solar cell element or a nonmolded thin bypass diode is known. The bypass diode need not be used when the breakdown voltage with respect to the reverse bias voltage to the solar cell element is higher than the reverser bias voltage generated by "partial shadow". The bypass diode is not an essential element in the present invention.

(Solar Cell Element)

A variety of single-crystal, polycrystalline, and amorphous solar cell elements conventionally known can be used. The materials of the solar cell element can be CIS, CdTe, and semiconductors such GaAs and Si.

Solar cell elements can be series-connected by known techniques such as laser scribing or interconnection. A bypass diode may be arranged for a plurality of series-connected solar cell elements.

(Solar Cell Module)

In addition to the solar cell modules having conventionally known super-straight and sandwich structures, a recent module is integrated with a building material. A plastic or glass member is used as a member on the light incident side. These changes and modifications are merely examples, and the present invention is not limited to them. The effect of the present invention can be enhanced in a solar cell module installed and fixed on an installation surface and having a wiring on its lower surface because voltage detection is difficult due to the wiring on the lower surface.

In the field of building materials, blocks made up of roof structure members and conventional solar cell modules serving as roof panels used in prefabricated residences are available. In a broad sense, such a block is one of the solar cell modules. In the present specification, such a block is defined as a building material with a solar cell module for clarity.

Solar Power Generation Apparatus

Figure 6:
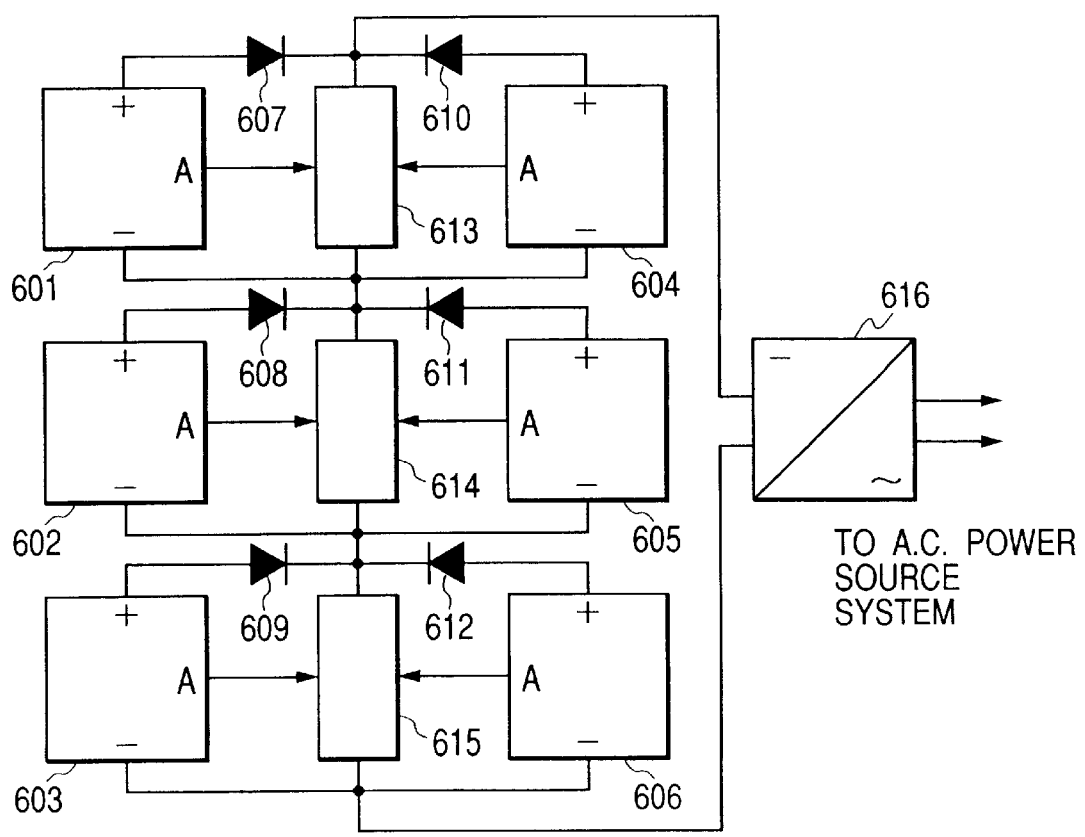
FIG. 6 is a block diagram showing the first mode of a solar power generation apparatus according to the present invention.
Figure 7:
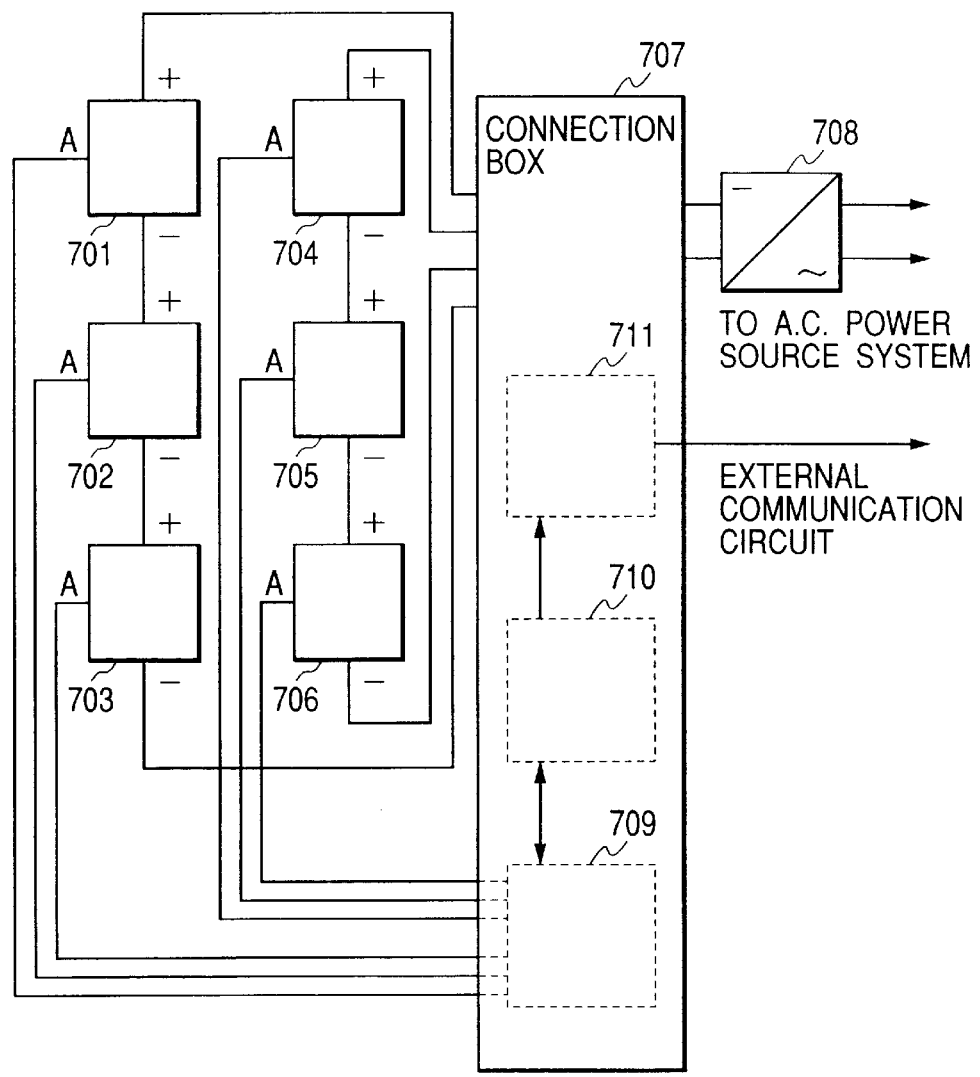
FIG. 7 is a block diagram showing the second mode of the solar power generation apparatus according to the present invention.

The modes of solar power generation apparatuses according to the present invention are shown in FIGS. 6 and 7.

<First Mode>

FIG. 6 shows the first mode of a solar power generation apparatus having the solar cell modules.

The solar power generation apparatus has solar cell modules 601 to 606. Each solar cell module is constructed of any one of the solar cell modules 105, 205, 305, 405, and 505 shown in FIGS. 1 to 5. The solar cell modules 601 to 606 form three pairs and each pair are connected in series with each other via corresponding ones of blocking diodes 607 to 612 to form one block. The respective blocks are connected in series with each other to form a solar cell array. Display unit 613 to 615 display signals output from the communication unit of the solar cell modules 601 to 606. Each display unit is connected to each pair of solar cell modules constituting each of the series-connected blocks. The display unit 613 to 615 are made of independent members separate from the solar cell modules 601 to 606. An indoor power-related device 616 includes an inverter. An electrical output from the solar cell array is connected to an AC power source system via the indoor power-related device 616.

The respective constituent elements will be supplementarily described.

(Blocking Diode)

A known high-power diode can be used. A diode having a low ON resistance is preferred. The blocking diode prevents power loss upon generating a reverse current to a low-potential series unit when a potential difference occurs between the series units of the solar cell module forming the solar cell array. The blocking diode is not an essential element in the present invention, and the solar cell array can operate without using the blocking diode.

(Indoor Power-Related Device)

The indoor power-related device includes all power distribution and control devices installed indoors. A general solar power generation apparatus is made up of a connection box for collecting all the outputs from the plurality of solar cell arrays into one line, an inverter connected to an AC system, and the like. The arrangements of the connection box and inverter will be supplementarily described.

[Connection Box]

The series units of solar cell modules can be connected parallel to each other on the installation surface. However, preferably, a connection box is arranged indoors, and the outputs from the solar cell modules are collected to one location for maintenance convenience. The connection box is made up of a fixing base for mainly fixing the output wiring lines of the series units, and a DC switch for cutting off the DC outputs for inspecting the blocking diodes and power control devices.

[Inverter]

The inverter includes various power control and protective circuits since functions include not only the DC/AC conversion function, but also the maximum power point tracing function of the solar cell module array, system synchronization function, and autonomous operation control function. The inverter is often called a power conditioner or power controller. At present, inverters for middle-scale solar power generation are on the stage of mass production, and various solar power generation apparatus manufacturers can use a variety of inverters.

(Display Unit)

The display unit 613 to 615 in the solar power generation apparatus are mounted on nonsolar power cell members constructing the solar cell module framing structure. The installation location of the nonsolar cell member is not particularly specified, but is preferably separate from the solar cell modules serving as measurement targets. More preferably, the nonsolar cell members are installed at the end portion of the installation surface of the solar cell module framing structure. The display element is not limited to a specific element, but is preferably constructed of a unit driven with a very small current. Examples of the display element are a display element using the physical properties of an LED, photochromic element, EL element, or liquid crystal, and a mechanical display element using the electrostrictive force of a piezoelectric element or the electromagnetic force of a magnet and coil.

In a solar power generation apparatus having the display unit 613 to 615 mounted on the solar cell module framing structure, the display unit is not arranged for each solar cell module, unlike the conventional solar cell module, the number of members can be reduced accordingly. In addition, the area of the light-receiving surface side of the solar cell module can be used for power generation at maximum. Since the limitations on design associated with display are not imposed, the degree of freedom of installation can increase.

<Second Mode>

FIG. 7 shows the second mode of the solar power generation apparatus. This solar power generation apparatus has a display unit in an indoor power-related device.

The solar power generation apparatus is made up of solar cell modules 701 to 707 each constructed of one of the modules shown in FIGS. 1 to 5, and a connection box 707. A display unit 709 for performing centralized display of output signals from communication terminals A of communication unit of the solar cell modules 701 to 706 is arranged in the connection box 707. The connection box 707 and an inverter 708 form a power-related device. The connection box 707 also includes an additional memory unit 710 and external communication unit 711.

(Display Unit)

The display unit 709 arranged in the solar power generation apparatus is arranged in the power-related device installed indoors. The location of the display unit 709 is not limited to a specific position in the power-related device, but is preferably in a device for directly receiving outputs from the solar cell modules serving as the measurement targets. More specifically, the display unit 709 is arranged in the connection box or inverter. The display unit is not limited to a specific one, but is preferably a unit driven with a very small current. Examples of the display element are a display element using the physical properties of an LED, photochromic element, EL element, or liquid crystal, and a mechanical display element using the electrostrictive force of a piezoelectric element or the electromagnetic force of a magnet and coil.

(Memory Unit)

The memory unit 710 stores the contents of the display unit. As the memory unit, a known IC memory can be used. Power cannot be generated at night in the solar power generation apparatus. When the power source of the memory unit is solar power, the memory unit is powered off. The memory unit 710 therefore is preferably comprised of a nonvolatile memory. The memory unit 710 is not an essential element in the present invention.

(External Communication Unit)

The external communication unit 711 notifies the subcontractor of the malfunction by communicating the display contents of the display unit or the storage contents of the memory unit via an existing communication line such as a telephone line. As the external communication unit 711, a modem such as a known IC can be used.

When the external communication unit 711 is arranged and a malfunction occurs, a system for notifying the subcontractor or power company of occurrence of the malfunction can be constructed to improve maintainability.

In this mode, the operator need not go up to the roof (installation surface of the solar cell module) to specify the malfunctioning solar cell module. When the memory unit 710 is also used, the detection results obtained under strong sunbeams can be stored, and the maintenance operation can be facilitated using the storage contents. Operability and safety can be further improved independently of weather conditions.

<First Embodiment>

FIGS. 8A to 11 show the first embodiment of the present invention, which will be described below.

Figure 8A:
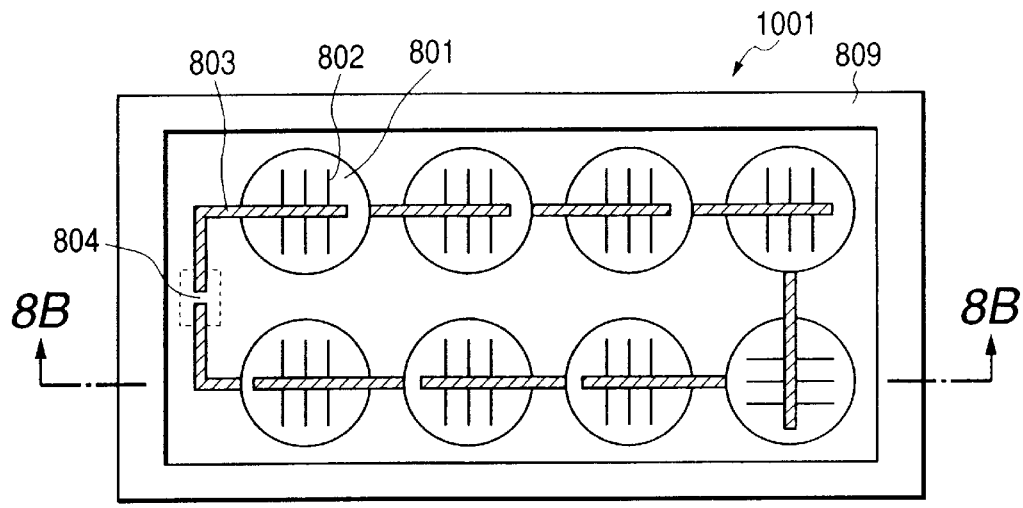
Figure 8B:
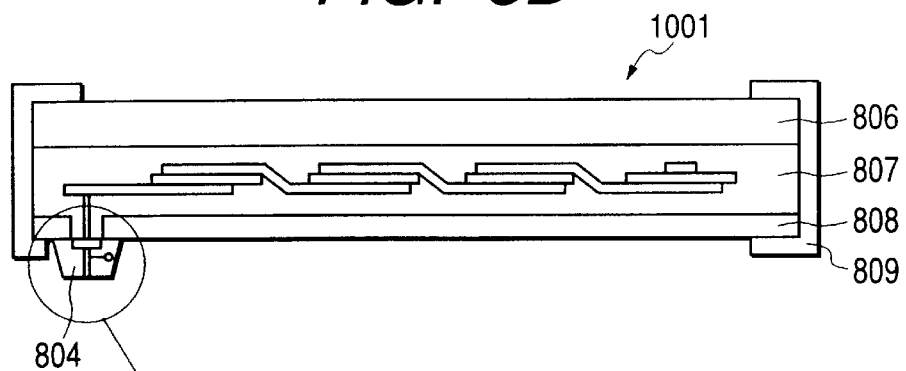
Figure 8C:
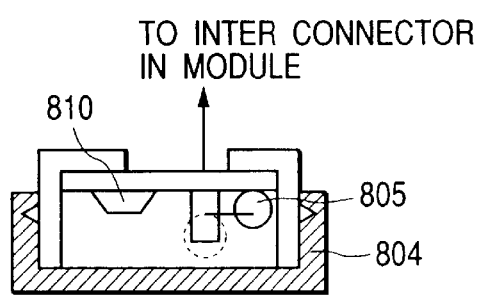

FIGS. 8A, 8B, and 8C are a schematic plan view, a schematic sectional view along the line 8B—8B, and an enlarged view of the terminal box, respectively, when the typical arrangement of the solar cell module called a so-called super-straight structure is applied to the present invention. The respective components will be described below.

A solar cell module 1001 of this embodiment has the following arrangement.

The solar cell module 1001 includes single-crystal silicon solar cell elements 801 and focusing electrodes 802. An interconnector member 803 connects the solar cell elements 801 in series with each other and supplies outputs from the elements to the output terminal of the solar cell module 1001. A terminal box 804 incorporates the output terminal of the solar cell module 1001. As shown in FIG. 8C, a bypass diode 805 and an integrated circuit 810 incorporating an electrical parameter detection unit and communication unit are arranged in the terminal box 804. The output terminal of the communication unit is arranged in the terminal box. A glass cover 806 protects the surface of the solar cell module 1001. A silicone resin 807 seals the solar cell elements 801. A lower-side moistureproof member 808 is made of Tedlar/aluminum/Tedlar. An aluminum frame 809 mechanically holds the solar cell module 1001.

In the solar cell module 1001, the integrated circuit having the communication unit is arranged in the terminal box 804. This can facilitate the assembly of the integrated circuit and the like and adjustment operations in the manufacture.

Figure 9:
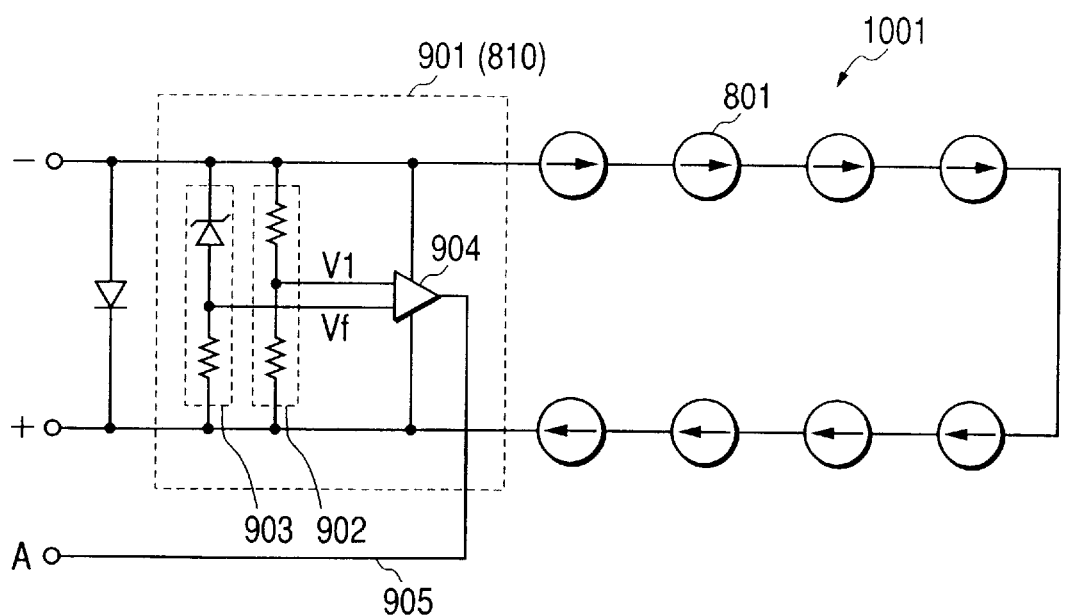
FIG. 9 is a circuit diagram showing an equivalent circuit of the solar cell module according to the first embodiment of the present invention.

FIG. 9 is a circuit diagram of the solar cell module 1001. An equivalent circuit 901 represents the electrical parameter detection unit and communication unit mounted on the integrated circuit 810. The electrical parameter detection unit and communication unit are made up of a comparator 904 for comparing a voltage V1 obtained from a resistance divider 902 with a reference voltage Vf generated by a constant voltage circuit 903 comprised of a series circuit of a Zener diode and resistor, and a line 905 for guiding a comparison output to the communication terminal A.

Figure 10:
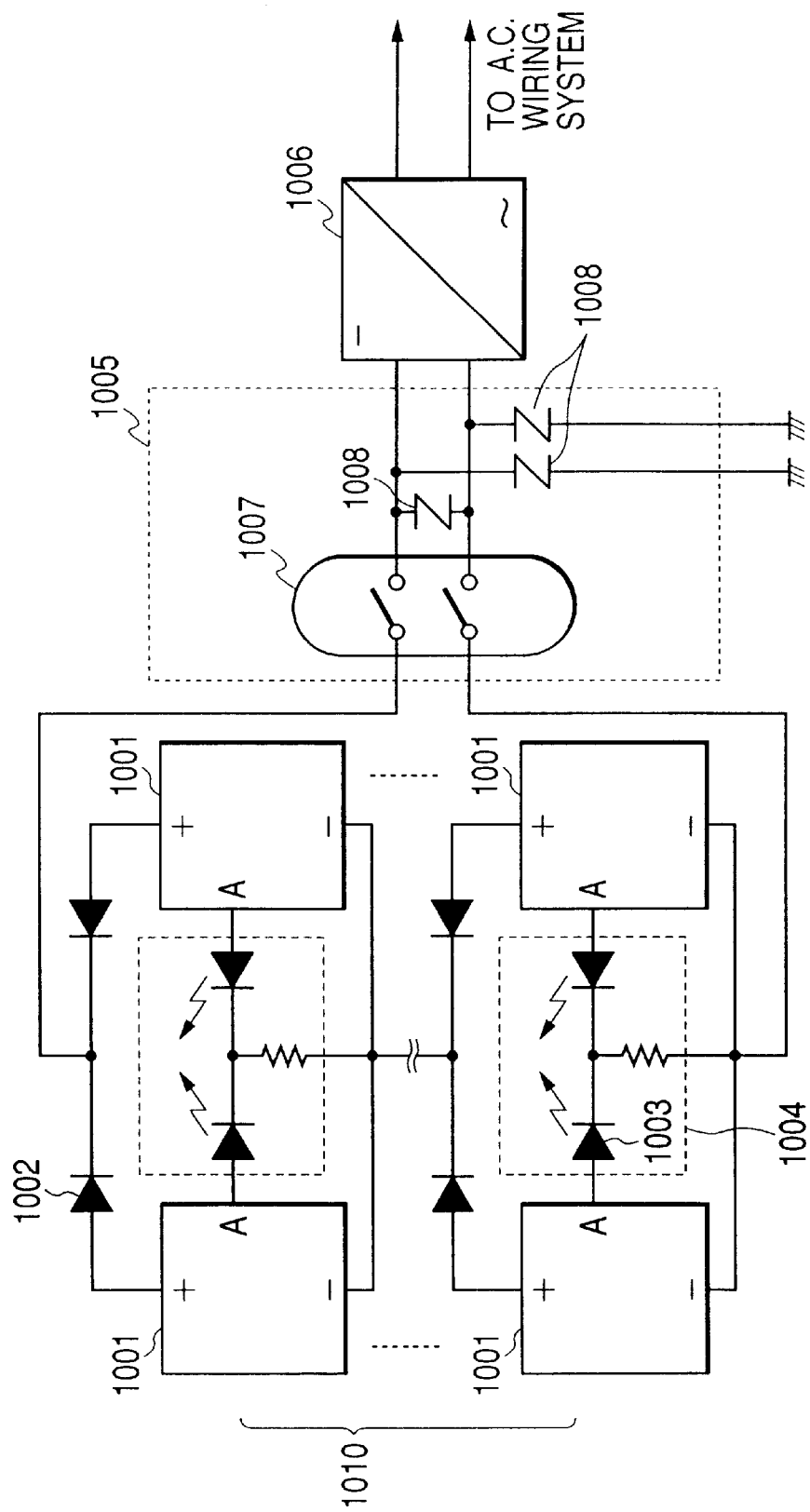
FIG. 10 is a block diagram of the solar power generation apparatus according to the first embodiment of the present invention.

FIG. 10 is a block diagram showing a solar power generation apparatus arranged using the solar cell modules. The respective components will be described below.

The solar power generation apparatus comprises solar cell modules 1001 described with reference to FIGS. 8A to 9, blocking diodes 1002, light-emitting diodes 1003 which are turned on upon reception of communication signals from the solar cell modules, and display unit 1004 each including light-emitting diodes.

The solar cell modules 1001 form pairs, and each pair are connected parallel to each other via corresponding ones of the blocking diodes 1002. The resultant blocks are connected in series with each other to form the solar cell array 1010. One display unit 1004 is connected parallel to each block so as to display a signal output from the communication unit of the solar cell module 1001 at the corresponding light-emitting diode 1003.

The solar cell array of this arrangement is made up of the above blocks. The electrical output from the solar cell array is finally supplied to a connection box 1005. The output is then supplied to a system synchronization inverter 1006 via a DC switch 1007 incorporated in the connection box 1005.

The output is connected to the AC wiring system via the system synchronization inverter 1006 and is used as power. Arrester elements 1008 prevent damage to the device from thunders.

FIGS. 11A and 11B are a schematic plan view and a sectional view, along the line 11A—11A, respectively, of the solar cell module 1001 and a solar cell module framing structure 1100 for holding the frames of the solar cell modules 1001, and show a state in which the framing structure 1100 is mounted on an existing corrugated roof 1009. The frame of the solar cell module 1001 is comprised of the aluminum alloy frame (aluminum frame) 809. The four corners of the frame 809 are clamped and fixed by fixing members 1103 each using a bolt 1102 attached to the corrugated roof 1009. A terminal box 1104 is arranged for each solar cell module 1001. A connection cable 1105 extends from this terminal box 1104. The connection cable 1105 connects all the solar cell modules 1001 to each other. The solar cell module 1001 is also connected to the display unit incorporated in a nonsolar cell member 1106 adjacent to the solar cell array via the connection cable 1105. The solar cell module 1001 is therefore electrically connected to the light-emitting diode 1003 of the display unit. The communication outputs from the solar cell modules 1001 are collected in units of blocks and displayed.

In the above structure, a malfunctioning solar cell module is specified as follows.

When a solar cell module 1001 in the solar cell array 1010 is normal, a communication signal obtained at the communication terminal A of the solar cell module 1001 in FIG. 10 is in an ON state. The light-emitting diode 1003 incorporated in the nonsolar cell member 1106 in FIG. 11 is always ON. The operator goes up to the roof daytime and checks the ON/OFF states of the light-emitting diodes of the nonsolar cell members 1106. Therefore, the malfunctioning solar cell module can be specified without forming a shadow on the solar cell module 1001.

In this embodiment, the solar cell array is mounted on the existing roof. However, building materials and general roofing materials with solar cell modules may be mixed and mounted as the solar cell module framing structure. In this case, the display unit may be incorporated in the general roofing materials serving as nonsolar cell members.

In the structure of this embodiment, the above maintenance problems can be solved, and the communication outputs from the solar cell modules can be collected and displayed in parallel units. The interface between the display unit and communication unit can be greatly simplified.

<Second Embodiment>

FIGS. 12A to 16 show the second embodiment of the present invention, which will be described in detail below.

FIGS. 12A, 12B, and 12C are a schematic plan view, a schematic sectional view along the line 12B—12B, and a schematic sectional view along the line 12C—12C, respectively, showing a solar cell module 1200 integral with a roofing material. The respective components will be described below.

This solar cell module 1200 is comprised of amorphous solar cell elements 1201 and bypass diodes 1202. An interconnector member 1203 connects the solar cell elements 1201 in series with each other, and supplies the outputs to positive and negative terminal boxes 1204 and 1205. A voltage detection wiring line is connected to the positive terminal box 1204.

A glass plate 1206 serves as a surface cover member. A sealing resin 1207 is impregnated with ethylene vinyl acetate and an inorganic filler. A polyethylene film 1208 insulates a coated steel plate 1209 for building from the interconnector member 1203. The coated steel plate 1209 has a downward bent portion 1210 to use the plate as a building material. The steel plate 1209 is fixed on a roof or the like using the downward bent portion.

Figure 13:
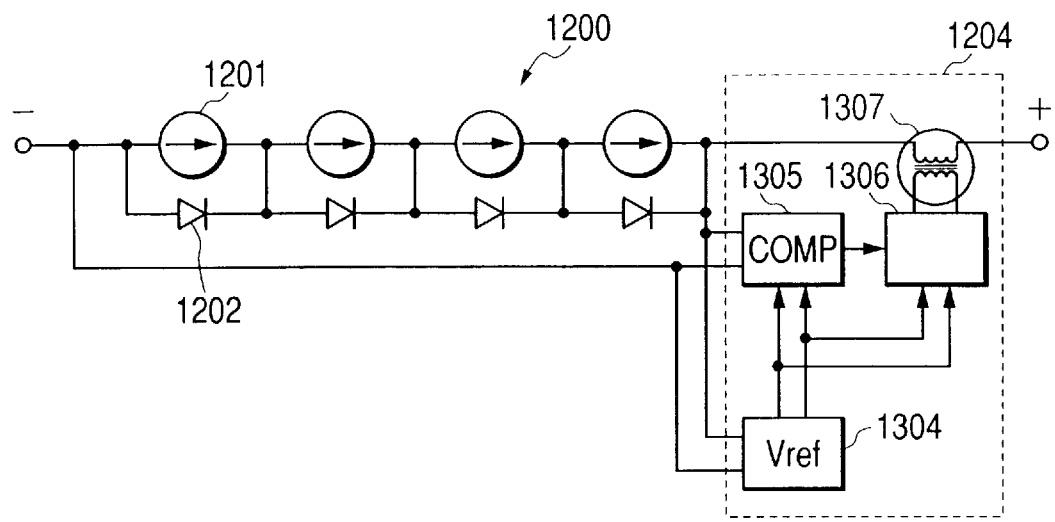
FIG. 13 is a circuit diagram showing an equivalent circuit of the solar cell module according to the second embodiment of the present invention.

FIG. 13 is a circuit diagram of the solar cell module 1200.

The bypass diode 1202 is connected in series with each amorphous solar cell element 1201. The resultant series units are connected in series with each other to form the solar cell module 1200. The positive terminal box 1204 incorporates a constant voltage circuit 1304 for supplying solar cell module power to the internal circuit, a comparator 1305 for detecting that the voltage of the solar cell module 1200 is a predetermined voltage or more, a signal generation unit 1306 for generating a unique signal in accordance with an output from the comparator 1305, and a transformer 1307 for superposing the oscillation signal on the DC output from the solar cell module 1200. An oscillator for generating a unique frequency signal is used as the signal generation unit 1306. When the solar cell module 1200 malfunctions, the power to the signal generation unit 1306 is interrupted. No frequency signal is generated.

Figure 14:
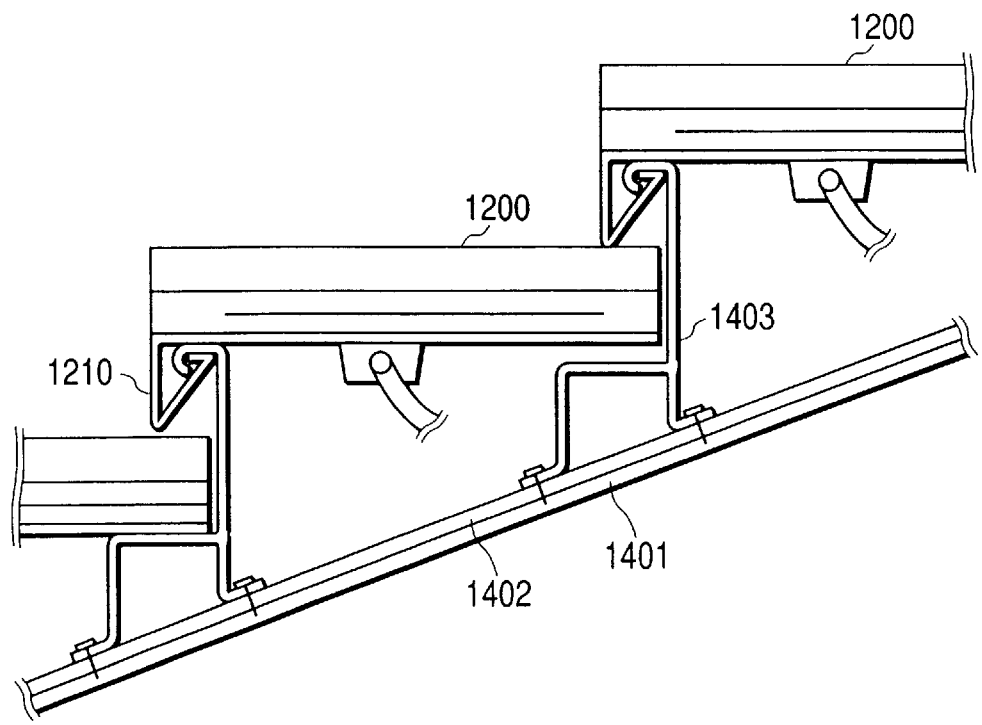
FIG. 14 is a view showing the structure of the solar cell module framing structure according to the second embodiment of the present invention.

As shown in FIG. 14, in this embodiment, the roof is constructed using the solar cell modules 1200 integral with the roofing materials. A waterproof sheet 1402 (or reinforcing roof) is placed on a roof bed material 1401, and fixing members 1403 are fixed. The fixing members 1403 are fitted with the downward bent portions 1210 to fix the solar cell modules 1201.

This roof structure has an outer appearance similar to a stepping-roof structure. A mechanical displacement is applied to the downward bent portion 1210 to remove each solar cell module integral with the roofing material. Some roofing materials can advantageously be replaced with new ones, thus resulting in convenience.

FIG. 15 is a block diagram showing a solar power generation apparatus using the solar cell modules 1200.

The solar power generation apparatus includes the solar cell modules 1200 and a power-related device 1502 including a connection box 1505 and system synchronization inverter 1507.

A solar cell array 1510 of the above arrangement is comprised of a first series unit 1511 having three solar cell modules 1200 and a second series unit 1512 having three other solar cell modules 1200. The solar cell modules 1200 incorporate signal generation units 1306 (oscillators) and oscillate unique frequencies f0, f1, f2, f3, f4, and f5, respectively. The first and second series units 1511 and 1512 are connected to blocking diodes 1504 via a DC switch 1503. The blocking diodes 1504 finally collect the electrical outputs. The electrical output sum is supplied to an AC wiring system (power system) via a DC switch 1506 on the system synchronization inverter side and the system synchronization inverter 1507. A signal separation unit 1508 extracts malfunction information on the basis of the unique frequency signals from the solar cell modules 1200 or their differences. A display unit 1509 displays the states of the individual solar cell modules on the basis of the frequency signals.

A method of specifying a malfunctioning solar cell module will be described with reference to FIG. 16. The waveforms of output voltages at the measurement points of systems A and B in FIG. 15 are displayed in states in graphs 1 and 2 of FIG. 16. Assume that a solar cell module incorporating the oscillator for generating the frequency f1 signal of system A in FIG. 15 malfunctions. In this case, no frequency f1 signal is generated. A signal (f0+f1+f2) in graph 1 is changed to a signal (f0+f2) in graph 3. That is, the signal (f0+f2) exhibits a decrease in output voltage and the omission of the superposed frequency f1 signal. The malfunction of the solar cell module incorporating the oscillator for generating the frequency f1 signal can be specified. Graph 4 in FIG. 16 shows a case in which both the solar cell modules incorporating the oscillators for generating the frequency f3 and f4 signals in system B in FIG. 15 malfunction. From this signal states, the malfunction of the solar cell modules incorporating the oscillators for generating the frequency f3 and f4 signals can be specified.

The frequencies used here are preferably determined depending on the relationship between the electrostatic capacitances of the solar cell modules. The solar cell modules having metal covers are often grounded, and the frequency signals are attenuated by the influences of electrostatic capacitances. For example, as in this embodiment, when amorphous solar cells having a metal substrate are used as solar cell elements, an electrostatic capacitance of about 60 pF is measured per 1 m$^2$. When high-frequency signals are used, they must have large amplitudes because they are greatly attenuated by the electrostatic capacitances. On the other hand, the amplitudes must be kept small to prevent each solar cell element from serving as an antenna for radiating radio waves outdoors. To balance these contradictory requirements, it is not preferable that a frequency of 1 MHz or more be superposed. In a polycrystalline solar cell element or a solar cell element not using a metal substrate, a higher frequency can be used because the electrostatic capacitance can be reduced.

One of the features of this embodiment is to superpose a frequency signal on an electrical output from each solar cell module. This allows extracting the malfunction information of any solar cell module from the power output line to the power-related device. With this arrangement, a dedicated wiring line for feeding such a signal need not be arranged. This can facilitate construction and maintenance, and further reduce the material cost of the dedicated line.

The signal separation unit 1508 extracts the malfunction information of the solar cell module on the basis of the above-described difference between the frequencies. The display unit 1509 displays the state of each solar cell module on the basis of the malfunction signal.

In this embodiment, the display unit 1509 is arranged in the connection box 1505. The signal is extracted before the input to the blocking diode 1504. This is because electrical outputs are not blocked by the blocking diodes 1504 and signals can be transmitted even if the malfunction occurs in many locations of the series units.

The signal separation unit 1508 and display unit 1509 can be formed using the state-of-the-art semiconductor techniques. A practical example of the signal separation unit is a bandpass filter, and signal separation using the bandpass filter can be used. Alternatively, for example, a signal is separated into a digital signal by an A/D converter, and the frequency component is separated by a demodulation method such as an existing frequency separation algorithm by a computer. Therefore, the malfunctioning solar cell module can be specified.

<Third Embodiment>

FIGS. 17A to 23 show the third embodiment of the present invention, which will be described below.

Figure 17A:
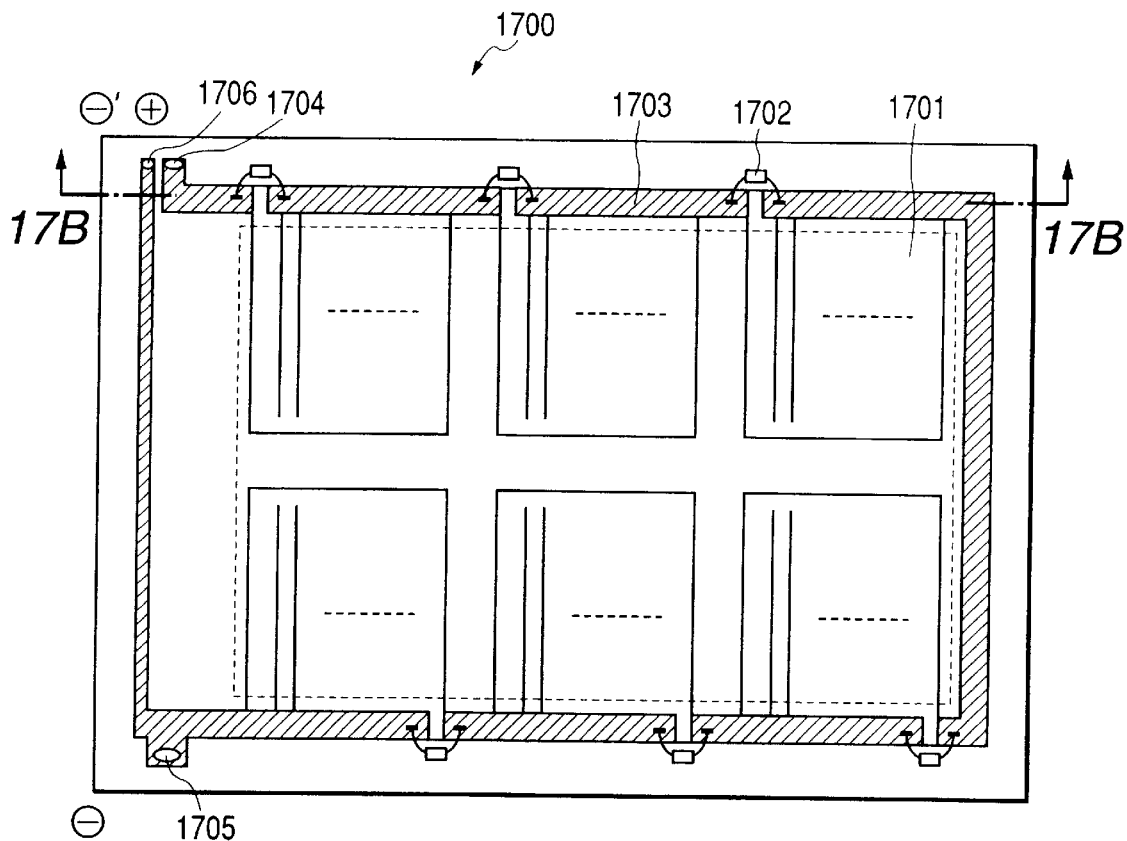
Figure 17B:
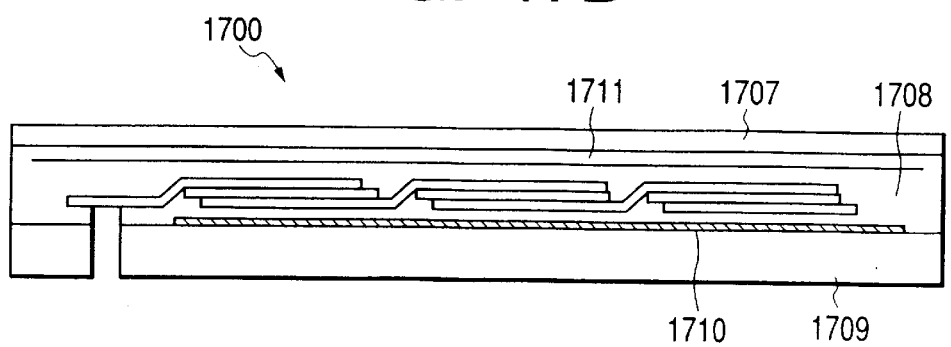

FIGS. 17A and 17B are a schematic plan view and a schematic sectional view along the line 17A—17B, respectively showing a super-straight solar cell module 1700. The respective components will be described below.

The solar cell module 1700 is comprised of amorphous solar cell elements 1701 and bypass diodes 1702. An interconnector member 1703 connects the solar cell elements 1701 in series with each other and supplies electrical outputs to positive and negative terminal boxes 1704 and 1705. A voltage detection negative terminal 1706 is formed near a location where the positive terminal box 1704 is arranged. A fluoroplastic film 1707 forms a surface cover member. A sealing resin 1708 is impregnated with ethylene vinyl acetate and an inorganic filler. A polyethylene film 1710 insulates 55% aluminum-zinc alloy coated steel plate 1709 from the interconnector member 1703. A decorative black polyethylene film 1711 is used to conceal the interconnector member 1703 from the upper surface.

Figure 18:
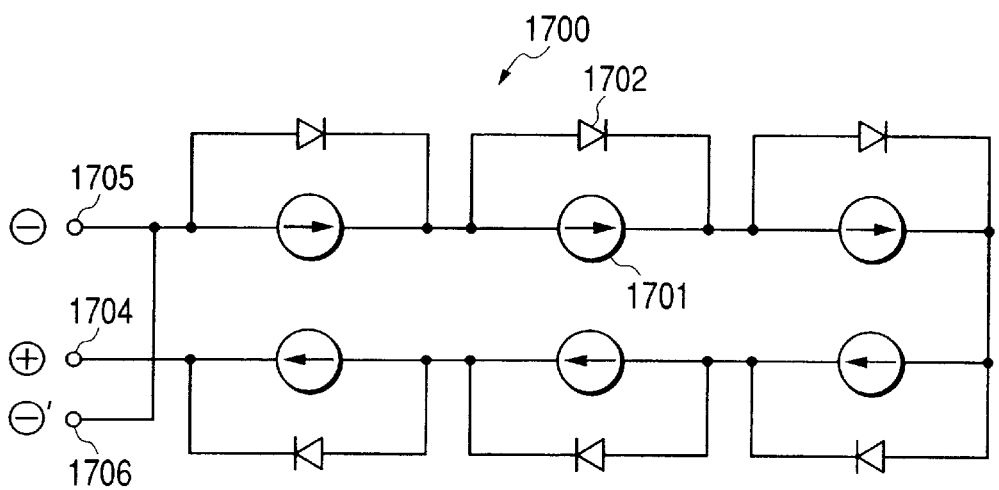
FIG. 18 is a circuit diagram of an equivalent circuit of the first solar cell module according to the third embodiment of the present invention.
Figure 19:
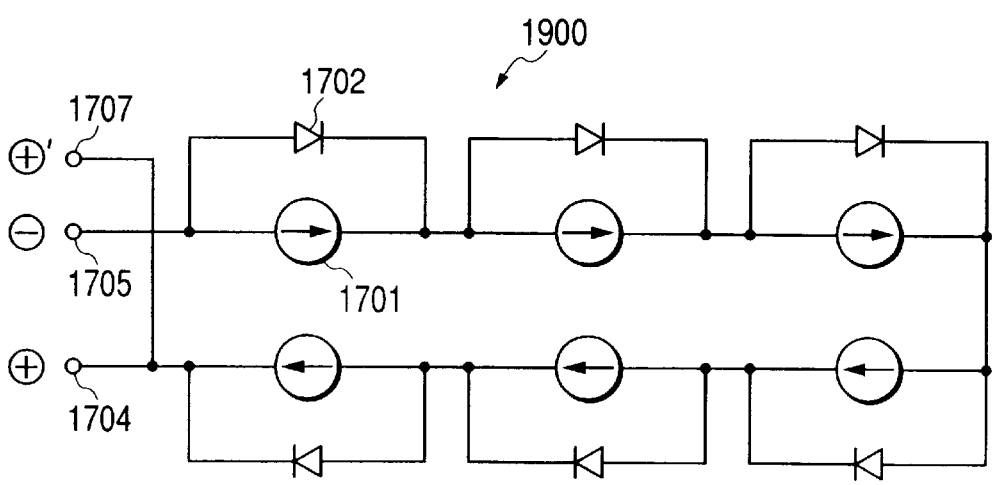
FIG. 19 is a circuit diagram of an equivalent circuit of the second solar cell module according to the third embodiment of the present invention.

FIG. 18 is a circuit diagram of the solar cell module 1700 described above. The bypass diode 1702 is connected to each solar cell element 1701.

In this embodiment, a solar cell module 1900 having the same shape as that of the solar cell module 1700 is prepared. The solar cell module 1900 has a voltage detection positive terminal 1707 shown in the circuit arrangement of FIG. 19.

Figure 21:
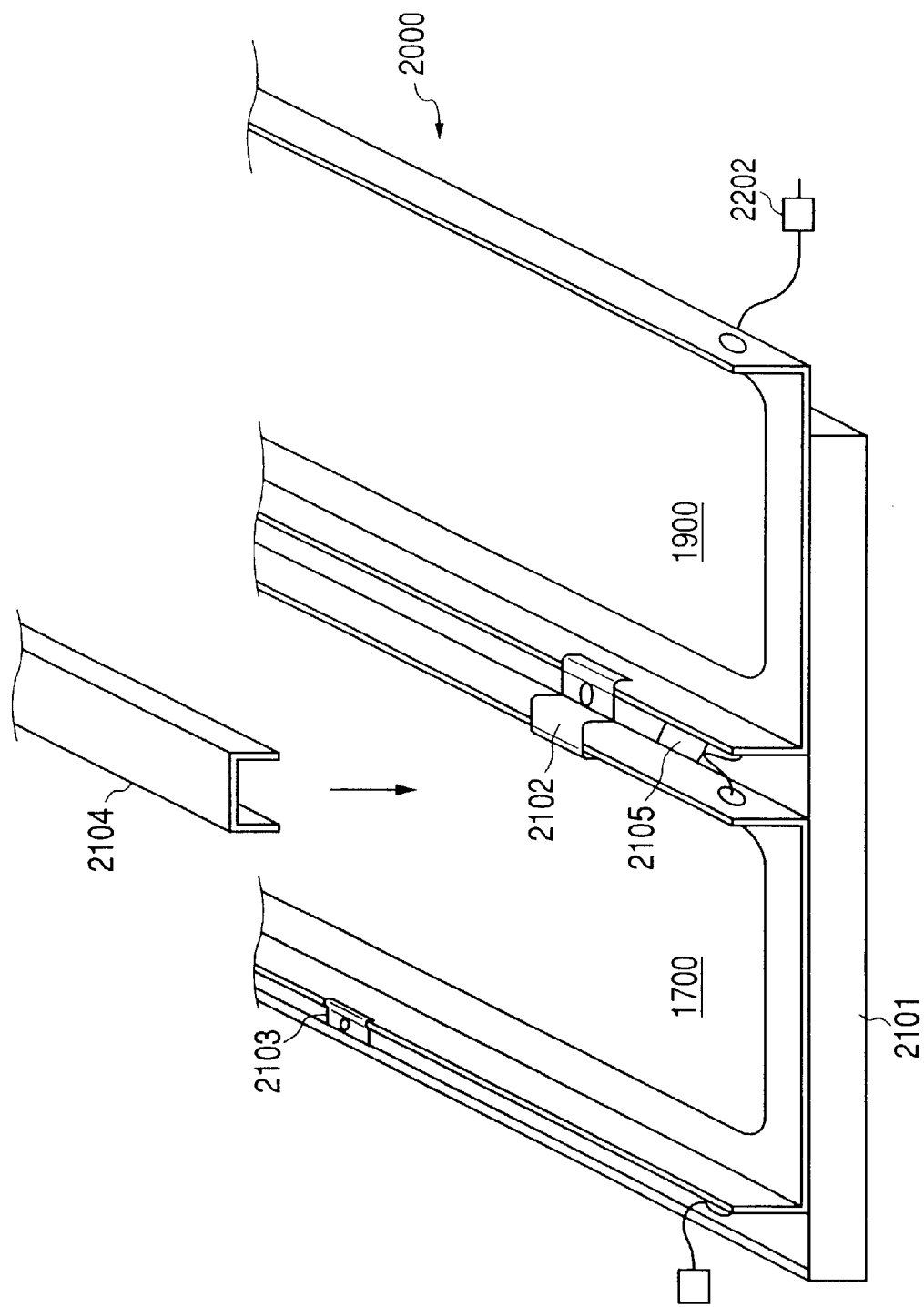
FIG. 21 is a schematic perspective view of a roof panel with solar cells according to the third embodiment of the present invention.

FIG. 21 is a perspective view illustrating a roof panel 2000 serving as building materials with solar cells constructed using the solar cell modules 1700 and 1900. The solar cell modules 1700 and 1900 having upright portions formed by bending opposing sides upward are placed on a roof panel structure member 2101. A clip 2102 is engaged with the adjacent upright portions and fixed to the structure member with a screw. A one-side clip 2103 fixes the end portion of the roof panel with the solar cell module 1700. A cap member 2104 covers the gap between the solar cell modules 1700 and 1900. A voltage detection inspection terminal is fixed to the solar cell module so as to be located at the center of the module. A terminal box 2105 connects the wiring lines of each solar cell module. In this embodiment, a communication unit is arranged in the terminal box 2105.

Figure 20:
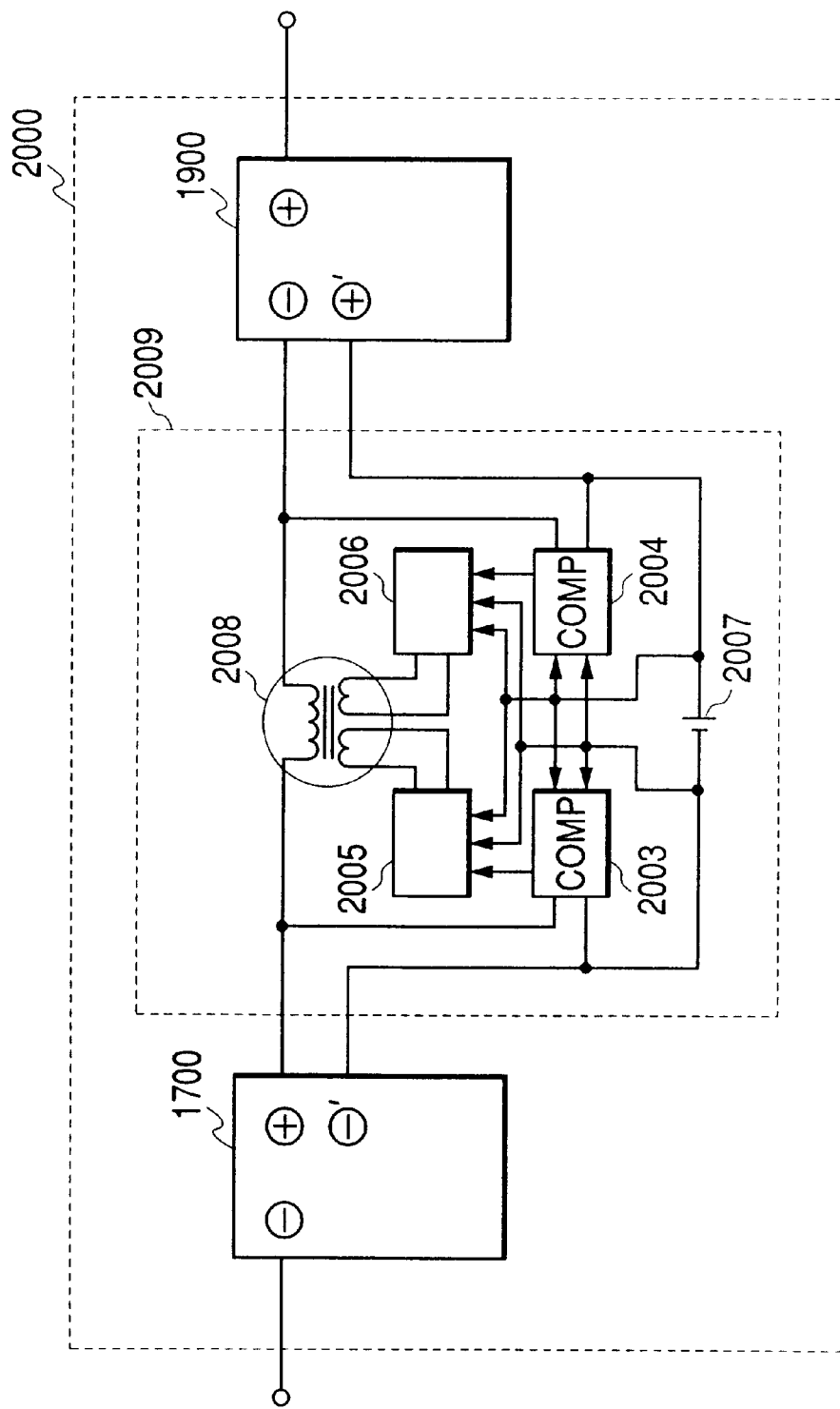
FIG. 20 is a block diagram of a roof panel with solar cells according to the third embodiment of the present invention.

FIG. 20 is a block diagram of the roof panel 2000. The roof panel 2000 includes the solar cell modules 1700 and 1900 shown in FIGS. 17A, 17B, 18 and 19, voltage detection comparators 2003 and 2004 serving as the electrical parameter detection unit, signal generation unit 2005 and 2006 for receiving outputs from the voltage detection comparators 2003 and 2004 and generating unique signals, and a power source circuit 2007 for supplying a power supply voltage to each circuit. A superposing unit 2008 constructed of a transformer superposes the signals generated by the signal generation unit 2005 and 2006 on the output lines of the solar cell modules. The communication unit is made up of the signal generation unit 2005 and 2006 and the superposing unit 2008. A range 2009 (detection communication unit) of the electrical parameter detection unit and communication unit can be formed into one chip by known semiconductor techniques.

Figure 22:
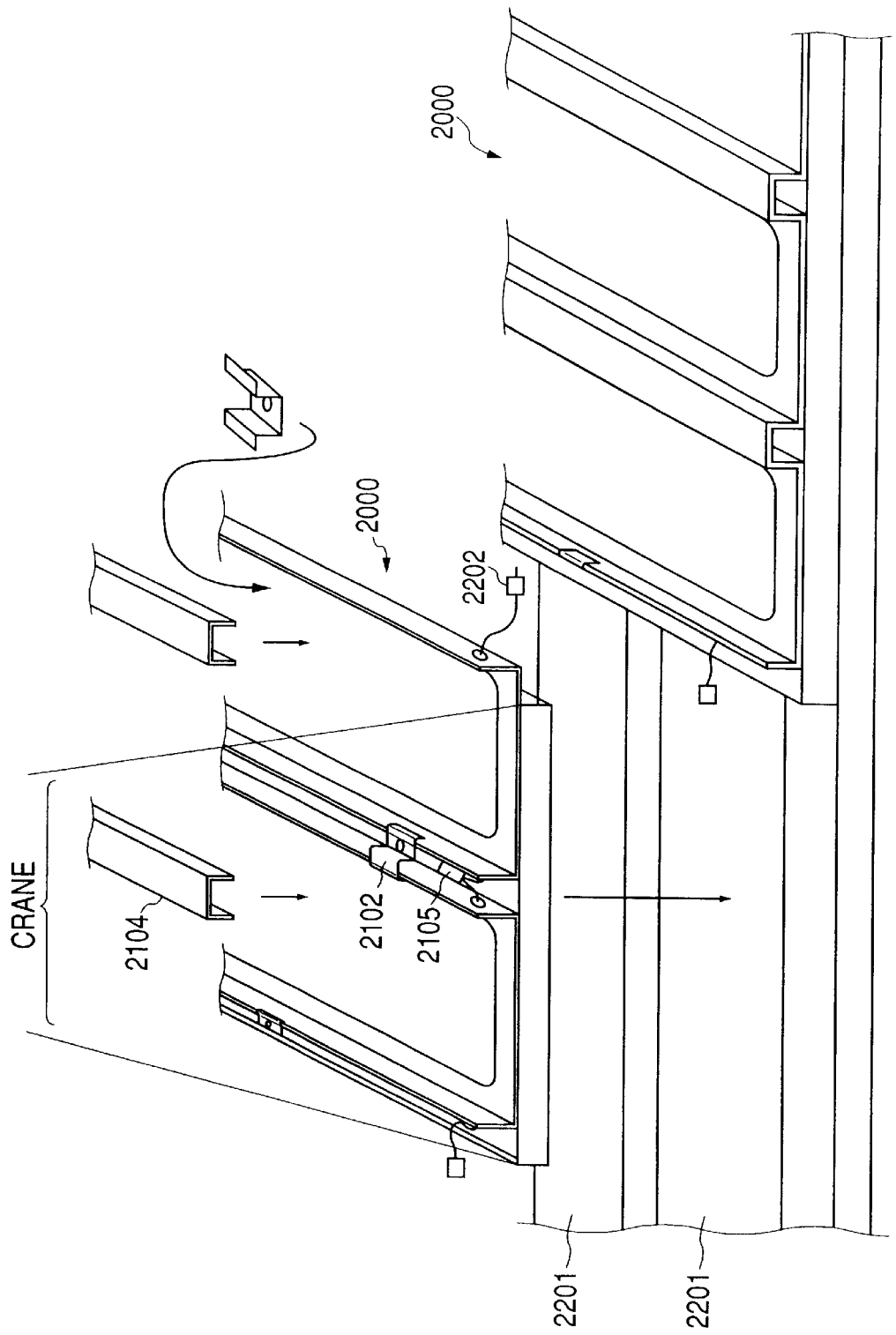
FIG. 22 is a view showing a method of forming a roof panel with solar cells according to the third embodiment of the present invention.

FIG. 22 shows a state in which the roof panel 2000 with solar cells is mounted on a roof. The roof panel can be lifted with a crane onto the roof structure member of a main house 2201 or the like and mounted on the roof structure member. The electrical wiring of the mounted roof panel 2000 is connected to that of the adjacent roof panel at a gap between them via a connection connector 2202. The roof panel is also fixed to the roof structure member of the main house or the like at this gap.

Figure 23:
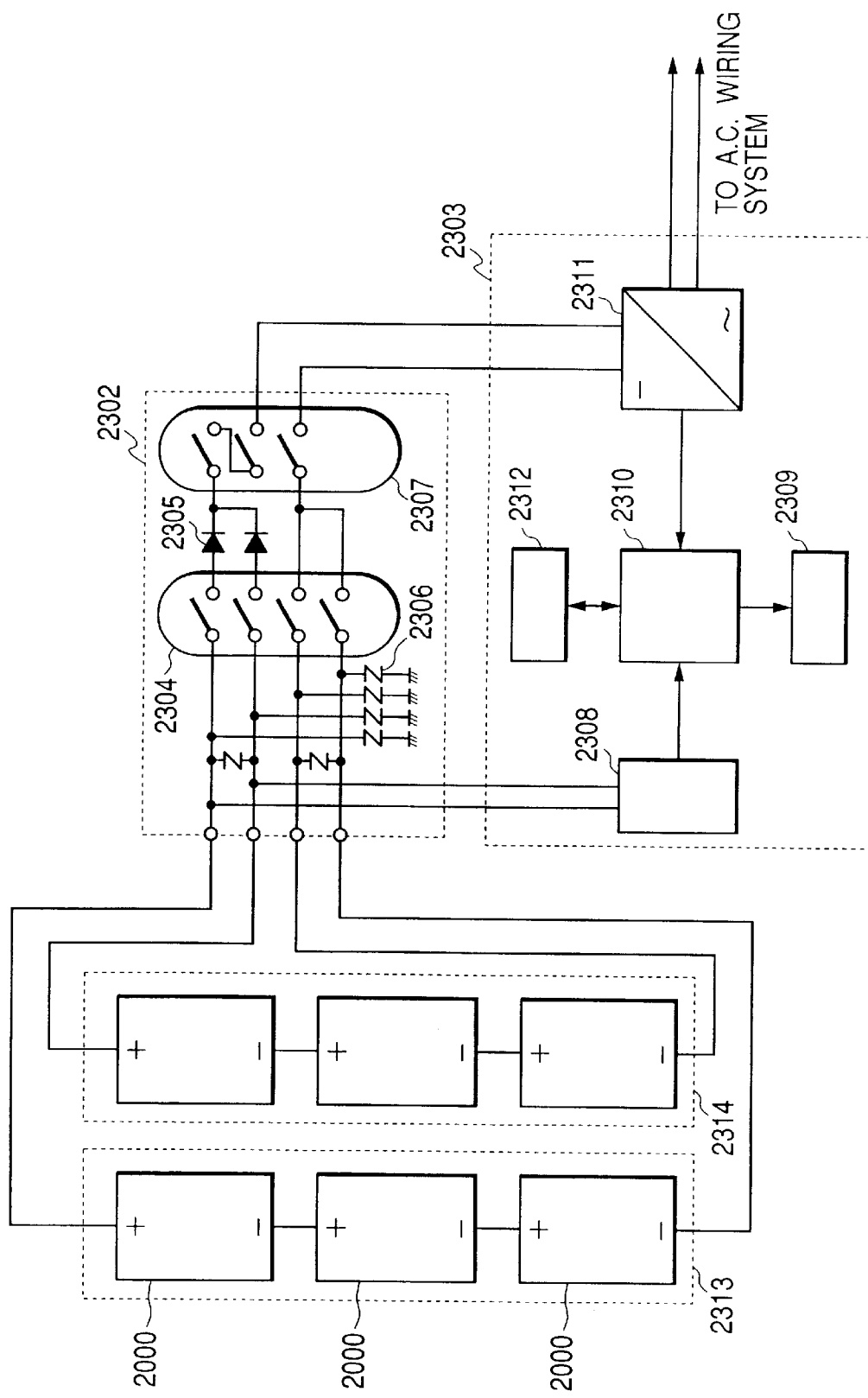
FIG. 23 is a block diagram showing the solar power generation apparatus according to the third embodiment of the present invention.
Figure 24A:
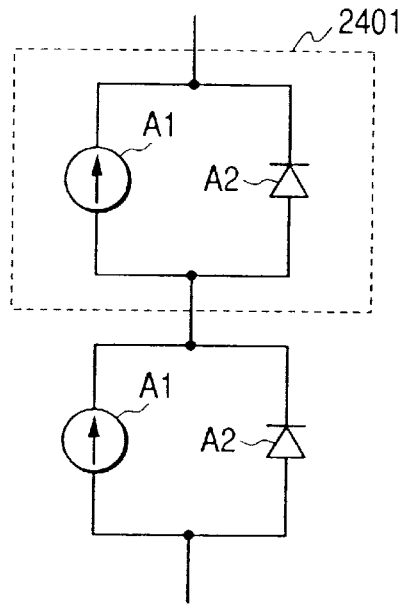
Figures 1, 24B:
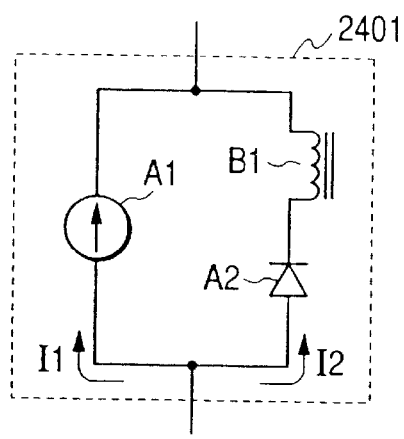
Figures 2, 24B:
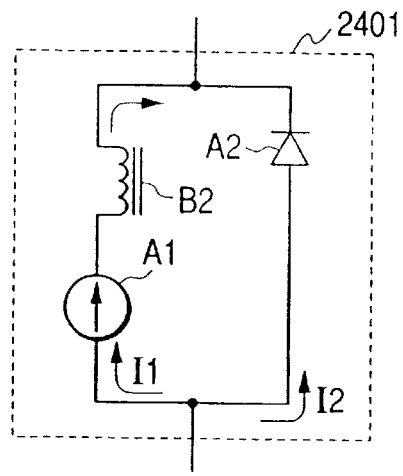
Figure 24C:
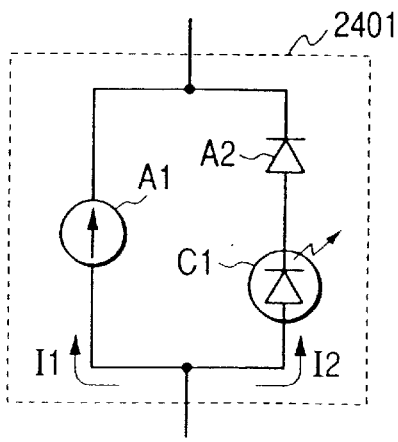

FIG. 23 is a block diagram showing the arrangement of a solar power generation apparatus using the roof panels with solar cell modules. The solar power generation apparatus is comprised of the roof panels 2000 with solar cell modules and a connection box 2302 for collecting power from the solar cell array made up of the roof panels with solar cell modules. The connection box 2302 includes a DC switch 2304 on the solar cell array side, blocking diodes 2305, an arrester element 2306, and a 3-wire DC switch 2307 on a power conditioner 2311 side.

In the solar power generation apparatus having the above arrangement, the electrical output lines of a first series unit 2313 obtained by series-connecting the roof panels 2000 with solar cell modules having signal generation unit for generating different signals and the electrical output lines of a second series unit 2314 obtained by series-connecting the roof panels 2000 with solar cell modules having signal generation unit for generating different signals are guided to the connection box 2302. These lines are connected to the blocking diodes 2305 via the DC switch 2304. The electrical outputs are collected and then connected to an inverter 2311 via the 3-wire DC switch 2307. The outputs are connected to an AC wiring system via the inverter 2311.

A power condition 2303 is connected to the AC system. In this embodiment, a signal separation unit 2308 and display unit 2309 are incorporated in the power conditioner 2303. The power conditioner 2309 also incorporates a microcomputer 2310, inverter 2311, and memory unit 2312. The signal separations unit 2308 extracts malfunction information on the basis of the presence/absence of signals from the signal generation unit 2005 and 2006 (FIG. 20) of the roof panels 2000 with solar cell modules, or the difference between the above signals. The microcomputer 2310 displays the normal/abnormal operating states of the solar cell modules 1700 and 1900 (FIG. 20) on the display unit 2309. The solar cell modules and the date and time of the malfunction of the solar cell module are stored in the memory unit 2312 and used for checking malfunction causes.

When signal separation as in the second embodiment is performed to allow demodulation using an arbitrary digital modulation scheme and hence signal detection depending on the program of the microcomputer. The malfunctioning solar cell module can be specified as in the second embodiment, and a detailed description thereof will be omitted.

According to the characteristic feature of this embodiment, of all the signals generated by the signal generation unit arranged in units of solar cell modules, signals output from two signal generation unit are superposed on the electrical outputs from the solar cell modules by one superposing unit. With this arrangement, the superposing unit need not be arranged for each solar cell module. An inexpensive solar power generation apparatus can be provided accordingly. In this embodiment, the roof panel 2000 includes the two solar cell modules 1700 and 1900 and the two signal generation unit 2005 and 2006, and one superposing unit 2008. Two signals can be superposed on the electrical signal of the solar cell module by one superposing unit regardless of the form of the roof panel, as a matter of course. Three or more signals generated by three or more signal generation unit can be superposed on the electrical outputs from the solar cell modules by using one superposing unit, thereby further reducing the cost. A circuit capable of generating any signal is used as the signal generation unit, and examples of the output signal are a periodic signal (e.g., a sinusoidal, triangular, or rectangular signal) and an intermittent (nonperiodic) signal generated in response to an input signal. Examples of the signal generation unit are the oscillator used in the second embodiment and a digital modulator. In particular, when a digital modulator is used to improve reliability in specifying the malfunctioning solar cell module by using a technique such as error correction. The digital modulator is more preferable than the oscillator.

The display unit is arranged on the power condition side and can be shared for the control computer and display device on the power conditioner side, thereby reducing the number of components and allowing providing an inexpensive solar power generation apparatus. When the memory unit is arranged, the information such as the process of malfunction can be stored and used for checking malfunction causes. In addition, the solar cell module need not be exchanged in a fine day.

<Fourth Embodiment>

A solar power generation apparatus is arranged in the same manner as in the second embodiment except that a pulse signal generator is used as the signal generation unit 1306 of each solar cell module 1200 shown in FIGS. 13 and 15.

Pulse signal generators 1306 of six solar cell modules 1200 generate pulse signals having different patterns. That is, the solar cell modules have pieces of ID information, respectively. When a given solar cell module 1200 malfunctions, the pulse signal generator 1306 arranged in this solar cell module is powered off. This pulse signal generator 1306 generates no signal.

FIG. 25A shows signal patterns generated by the pulse signal generators 1306 of three solar cell modules 1200 constructing a first series unit 1511. These signal patterns are referred to as p1, p2, and p3, respectively.

When the three solar cell modules normally operate, the signals p1, p2, and p3 are superposed on each other, and the resultant signal as shown in FIG. 25B is superposed on the electrical outputs from the solar cell modules constructing a system A. When the solar cell module having the signal p1 malfunctions, the signal p1 is not superposed on the system A, so that a signal as shown in FIG. 25C is superposed on the electrical outputs from the solar cell modules of the system A. Similarly, when the solar cell module having the signal p2 malfunctions, a signal as shown in FIG. 25D is superposed on the system A. Similarly, when the solar cell module having the signal p3 malfunctions, a signal as shown in FIG. 25E is superposed on the system A. When the solar cell module having the signal p1 normally operates and the remaining solar cell modules of the first series unit 1511 malfunction, only the signal p1 indicated by FIG. 25A is superposed on the system A. Similarly, when only the solar cell module having the signal p2 normally operates, only the signal p2 indicated by FIG. 25A is superposed on the system A. Similarly, when the solar cell module having the signal p3 normally operates, only the signal p3 indicated in FIG. 25A is superposed on the system A.

(1) When all the three solar cell modules constructing the first series unit 1511 normally operate, (2) when one of them malfunctions, or (3) when any one of them normally operates (two remaining solar cell modules malfunction), different signals are superposed on the system A. In case (2), even if any one of the three solar cell modules malfunctions, different signal are supposed on the system A. Similarly, in case (3), even if any one of the three solar cell modules normally operates, different signals are superposed on the system A. Therefore, the malfunctioning solar cell module can be specified.

In this embodiment, the signals p1, p2, and p3 are synchronized with each other, but need not be synchronized with each other. For example, the generation timings of the signals p1, p2, and p3 are shifted from each other not to overlap the signals p1, p2, and p3. In this case, the patterns of the signals p1, p2, and p3 are different from each other, so that the presence/absence of the signals p1, p2, and p3 can be easily determined.

As described above, the solar cell modules of the solar power generation apparatus of the second, third, or fourth embodiment have the pieces of ID information, respectively. More specifically, in the second embodiment, the solar cell modules have different frequency signals, and these frequency signals serve as the pieces of ID information of the solar cell modules, respectively. In the third embodiment as well, the different frequency signals or signals generated by the digital modulator serve as the pieces of ID information, respectively. In the fourth embodiment, the pulse signals having different patterns are used as the pieces of ID information, respectively. In this manner, since the solar cell modules have the pieces of ID information, respectively, a malfunctioning solar cell module can be specified. Examples of the signal (ID information) generated by the signal generation unit are a periodic signal (e.g., a sinusoidal, triangular, or rectangular signal) and an intermittent (nonperiodic) signal generated in response to an input signal.

The signal generation unit need not continuously operate during the operation of the corresponding solar cell module, but can periodically generate a signal. The periodic interval is, e.g., an interval of 30 min, 1 hr, or 1 day. Therefore, the power consumed by the signal generation mean can be reduced, and a larger amount of power can be extracted from the solar cell modules.

As has been described above, according to the present invention, since a communication unit is arranged in a solar cell module, the operator need not check near a solar cell module whether it malfunctions. The shadow of the operator himself is not formed on the solar cell module, and the malfunction can be accurately determined.

A display unit which receives a signal from a communication unit is arranged in a nonsolar cell member constructing a solar cell module framing structure, thereby reducing the material cost of the display unit.

When a display unit which receives a signal from a communication unit is incorporated in an indoor power-related device, the operator need not go up to the installation surface of the solar cell module to specify the malfunctioning solar cell module. The labor can be reduced to improve maintainability.

A communication unit for communicating with an external device via a telephone line or the like can be operated in synchronism with a computer in the power-related device. More accurate malfunction detection than the conventional malfunction detection is allowed in accordance with a large number of temporal information and parameter information.

Signal generation unit for generating specific signals are arranged for solar cell modules, respectively. A malfunctioning solar cell module can be specified in accordance with the presence/absence of such signals or the difference of these signals.

The signals generated by the signal generation unit are superposed on the electrical outputs of the solar cell modules by using a superposing unit. The electrical output cable of the solar cell module can also be used as a path for such a signal. Therefore, this signal can easily be fed up to the power-related device such as an inverter without arranging any dedicated wiring line, thus facilitating construction and maintenance. In addition, the material cost of the dedicated wiring line can be omitted.

As has been described above, according to the present invention, a malfunctioning solar cell module can be easily specified, thus improving maintainability.

What is claimed is:

1. A first solar cell module operable in an array together with a second solar cell module, said first solar cell module comprising:

a solar cell element;

an electrical parameter detection unit for the solar cell element; and a communication unit for performing communication in accordance with an output from said electrical parameter detection unit, wherein said first solar cell module contains ID information and the communication unit is adapted to transmit said ID information in accordance with the output from said electrical parameter detection unit, and wherein the ID information for the first solar cell module is different from ID information for the second solar cell module.

2. A module according to claim 1, wherein said electrical parameter detection unit comprises one of a current detection unit and a voltage detection unit.

3. A module according to claim 2, wherein said current detection unit comprises an operating current detection unit for detecting an operating current of the solar cell element.

4. A module according to claim 2, wherein said voltage detection unit comprises a voltage detection unit for detecting a terminal voltage across one or a plurality of solar cell elements of series-connected solar cell elements.

5. A module according to claim 1, wherein said first solar cell module comprises a terminal box, and said electrical parameter detection unit and said communication unit are arranged in said terminal box.

6. A module according to claim 1, wherein said communication unit comprises a signal generation unit which generates the ID information.

7. A module according to claim 6, wherein said signal generation unit comprises an oscillator.

8. A module according to claim 6, wherein said signal generation unit comprises a digital modulator.

9. A module according to claim 6, wherein said communication unit comprises a superposing unit for superposing a signal generated by said signal generation unit on an electrical output from said first solar cell module.

10. A module according to claim 9, wherein said superposing unit comprises a transformer.

11. A building member comprising:

a first solar cell module operable in an array together with a second solar cell module and comprising a solar cell element;

an electrical parameter detection unit for the solar cell element; and a communication unit for performing communication in accordance with an output from said electrical parameter detection unit, wherein said first solar cell module contains ID information and the communication unit is adapted to transmit said ID information in accordance with the output from said electrical parameter detection unit, and wherein the ID information for the first solar cell module is different from ID information for the second solar cell module.

12. A solar cell module framing structure comprising:

a first solar cell module operable in an array together with a second solar cell module and comprising a solar cell element;

an electrical parameter detection unit for the solar cell element;

a communication unit for performing communication in accordance with an output from said electrical parameter detection unit, and a display unit responding to a signal from said communication unit, said display unit being arranged in a nonsolar cell member, wherein said first solar cell module contains ID information and the communication unit is adapted to transmit said ID information in accordance with the output from said electrical parameter detection unit, and wherein the ID information for the first solar cell module is different from ID information for the second solar cell module.

13. A framing structure according to claim 12, wherein said communication unit comprises a signal generation unit.

14. A solar cell module framing structure comprising:

a first solar cell module operable in an array together with a second solar cell module and comprising a solar cell element;

an electrical parameter detection unit for the solar cell element;

a signal generation unit for generating a signal in accordance with an output from said electrical parameter detection unit;

a superposing unit for superposing the signal on an electrical output from said first solar cell module;

a signal separation unit for separating the signal superposed on the electrical output from the electrical output; and a display unit responding to a signal from said signal separation unit, said display unit being arranged in a nonsolar member, wherein said first solar cell module contains ID information and the signal generation unit is adapted to transmit said ID information in accordance with the output from said electrical parameter detection unit, and wherein the ID information for the first solar cell module is different from ID information for the second solar cell module.

15. A solar power generation apparatus having a plurality of solar cell modules, comprising a signal generation unit in each of the plurality of solar cell modules, wherein the plurality of solar cell modules have pieces of ID information, respectively, and wherein the pieces of ID information are different frequency signals generated by each signal generation unit, respectively or are pulse signals having different patterns generated by each signal generation unit, respectively.

16. An apparatus according to claim 15, wherein the pieces of ID information are pulse signals having different patterns generated by each signal generation unit, respectively.

17. An apparatus according to claim 15, wherein each signal generation unit generates a signal when a solar cell module having said signal generating unit is operating or inoperative.

18. An apparatus according to claim 15, wherein each signal generation unit periodically generates a signal.

19. An apparatus according to claim 15, wherein each signal generation unit comprises an oscillator.

20. An apparatus according to claim 15, wherein each signal generation unit comprises a pulse signal generator.

21. An apparatus according to claim 15, wherein each signal generation unit comprises a digital modulator.

22. An apparatus according to claim 15, further comprising a superposing unit for superposing a signal generated by each signal generation unit on an electrical output of each solar cell module.

23. An apparatus according to claim 22, wherein said superposing unit comprises a transformer.

24. An apparatus according to claim 22, wherein said superposing unit superposes a plurality of signals generated by a plurality of said signal generation unit on the electrical outputs from said solar cell modules.

25. An apparatus according to claim 22, further comprising a signal separation unit for separating the signals superposed on the electrical outputs from the electrical outputs.

26. An apparatus according to claim 25, further comprising a display unit responding to a signal from said signal separation unit.

27. An apparatus according to claim 26, wherein said solar power generation apparatus comprises a power-related device, and said display unit is arranged in said power-related device.

28. An apparatus according to claim 27, wherein said power-related device comprises an inverter.

29. A first solar cell module operable in an array together with a second solar cell module, said first solar cell module comprising:

(a) a solar cell element which generates an electrical output; and (b) a signal generation unit adapted to generate a signal in accordance with the electrical output from the solar cell element, wherein the signal which is a piece of ID information for the first solar cell module is different from a signal which is a piece of ID information for the second solar cell module.

* * * * *